(12) United States Patent
Tiwari et al.

(10) Patent No.: US 10,991,867 B2
(45) Date of Patent: Apr. 27, 2021

(54) HIGH-PERFORMANCE TERBIUM-BASED THERMOELECTRIC MATERIALS

(71) Applicant: University of Utah Research Foundation, Salt Lake City, UT (US)

(72) Inventors: Ashutosh Tiwari, Salt Lake City, UT (US); Shrikant Saini, Salt Lake City, UT (US); Kun Tian, Salt Lake City, UT (US); Haritha Sree Yaddanapudi, Salt Lake City, UT (US); Yinong Yin, Salt Lake City, UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 449 days.

(21) Appl. No.: 15/670,933

(22) Filed: Aug. 7, 2017

(65) Prior Publication Data

US 2018/0130936 A1 May 10, 2018

Related U.S. Application Data

(63) Continuation-in-part of application No. 15/604,618, filed on May 24, 2017.

(Continued)

(51) Int. Cl.
*H01L 35/34* (2006.01)
*H01L 35/28* (2006.01)
(Continued)

(52) U.S. Cl.
CPC .............. *H01L 35/22* (2013.01); *C01G 45/12* (2013.01); *C01G 49/009* (2013.01); *C01G 51/68* (2013.01);
(Continued)

(58) Field of Classification Search
None
See application file for complete search history.

(56) References Cited

U.S. PATENT DOCUMENTS 9,059,364 B2 6/2015 Snyder et al.
9,437,796 B2 9/2016 Venkatasubramanian et al.
(Continued)

FOREIGN PATENT DOCUMENTS

EP 0789671 A1 12/2006
EP 2770069 A1 8/2014
(Continued)

OTHER PUBLICATIONS

Flahaut et al.; "Thermoelectrical Properties of A-Site Substituted Ca1xRExMn03 System." Journal of Applied Physics; Oct. 2006; vol. 100, Issue 8; pp. 084911-084913.
(Continued)

*Primary Examiner* — Niki Bakhtiari
(74) *Attorney, Agent, or Firm* — Thorpe North & Western, LLP

(57) ABSTRACT

A thermoelectric material, having a formula $Tb_xM1_{y-x}M2_zO_w$ where M1 is one of Ca, Mg, Sr, Ba and Ra, M2 is at least one of Co, Fe, Ni, and Mn, x ranges from 0.01 to 5; y is 1, 2, 3, or 5; z is 1, 2, 3, or 4; and w is 1, 2, 3, 4, 5, 7, 8, 9, or 14. The thermoelectric material is chemically stable within 5% for one year and is also non-toxic. The thermoelectric material can also be incorporated into a thermoelectric system which can be used to generate electricity from waste heat sources or to cool an adjacent region.

15 Claims, 18 Drawing Sheets

Related U.S. Application Data

(60) Provisional application No. 62/340,663, filed on May 24, 2016.

(51) Int. Cl.
*H01L 35/22* (2006.01)
*C01G 51/00* (2006.01)
*H01L 35/08* (2006.01)
*C01G 49/00* (2006.01)
*C01G 53/00* (2006.01)
*C01G 45/12* (2006.01)

(52) U.S. Cl.
CPC ............ *C01G 51/70* (2013.01); *C01G 53/68* (2013.01); *H01L 35/08* (2013.01); *H01L 35/28* (2013.01); *H01L 35/34* (2013.01); *C01P 2002/50* (2013.01); *C01P 2002/70* (2013.01); *C01P 2002/72* (2013.01); *C01P 2002/77* (2013.01); *C01P 2002/85* (2013.01); *C01P 2004/03* (2013.01); *C01P 2004/04* (2013.01); *C01P 2006/32* (2013.01); *C01P 2006/40* (2013.01); *Y02P 20/129* (2015.11)

(56) References Cited

U.S. PATENT DOCUMENTS

| | | |
|---|---|---|
| 2001/0017152 A1 | 8/2001 | Funahashi et al. |
| 2002/0037813 A1 | 3/2002 | Funahashi et al. |
| 2002/0069907 A1 | 3/2002 | Yamashita |
| 2002/0157699 A1 | 10/2002 | Ichinose et al. |
| 2004/0232893 A1 | 11/2004 | Odagawa et al. |
| 2006/0118160 A1 | 6/2006 | Funahashi et al. |
| 2006/0255310 A1 | 11/2006 | Funahashi |
| 2007/0125412 A1 | 6/2007 | Funahashi |
| 2007/0144573 A1 | 6/2007 | Toshiyuki et al. |
| 2009/0178700 A1 | 7/2009 | Heremans et al. |
| 2010/0051079 A1 | 3/2010 | Majumdar et al. |
| 2011/0031451 A1 | 2/2011 | Kazuo et al. |
| 2012/0024333 A1 | 2/2012 | Lee et al. |
| 2012/0097206 A1 | 4/2012 | Kazuo et al. |
| 2014/0209140 A1 | 7/2014 | Funahashi et al. |

FOREIGN PATENT DOCUMENTS

| | | |
|---|---|---|
| JP | 5035561 B2 | 9/2012 |
| JP | 2014/060223 A | 4/2014 |

OTHER PUBLICATIONS

Liu et al.; "Thermoelectric Properties of Ca3xyxCo409+ Ceramics." Journal of Physics and Chemistry of Solids; Mar.-Apr. 2009; vol. 70; pp. 600-603.

Klyndyuk et al.; "Synthesis and Properties of Ca2.8Ln0.2Co409 + (Ln = La, Nd, Sm, Tb—Er) Solid Solutions." Inorganic Materials; Pleiades Publishing, Ltd.; 2012; vol. 48, Issue 10; pp. 1052-1057.

Rasekh et al.; "Thermoelectric Properties of Rare Earth doped Ca3—xRExCo409 (Re+Dy, Er, Gd,)" Journal of Electroceramics; Jun. 2014; vol. 32, Issue 4; pp. 376-82.

● O   M2   M1   Tb

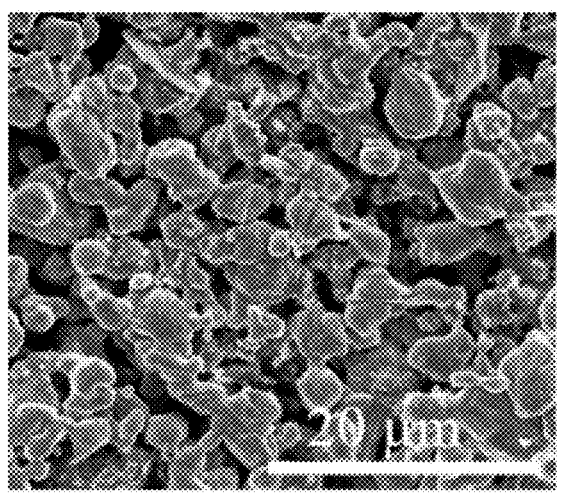
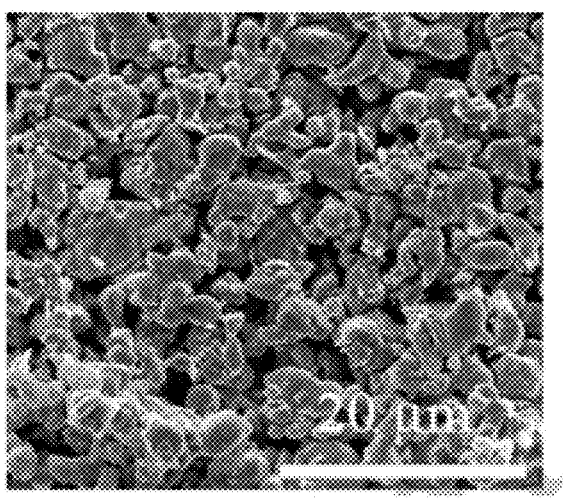
FIG. 7A  FIG. 7B
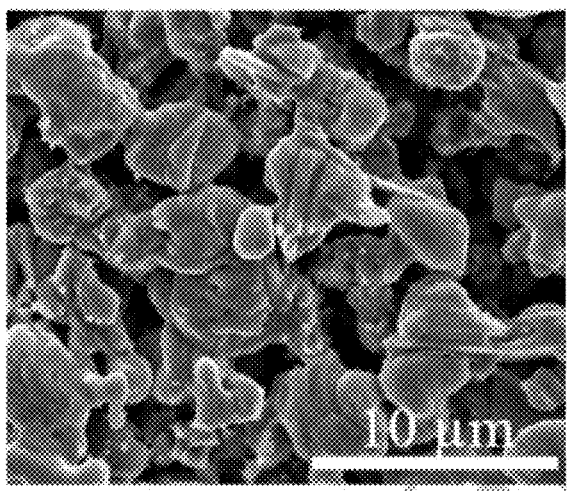
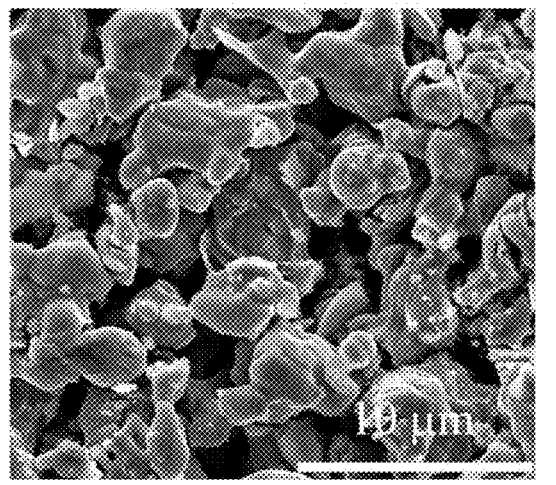
FIG. 7C  FIG. 7D
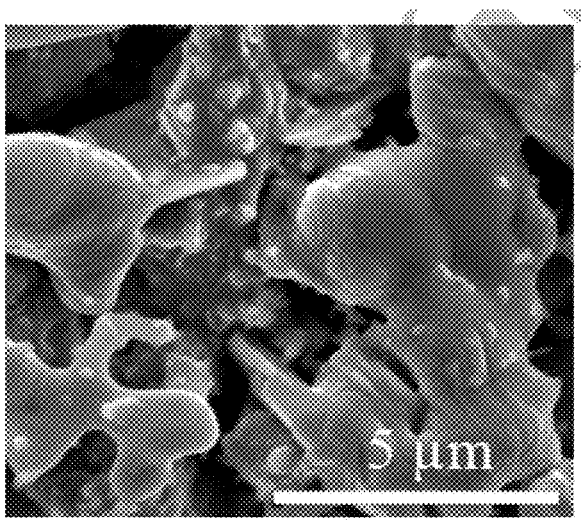
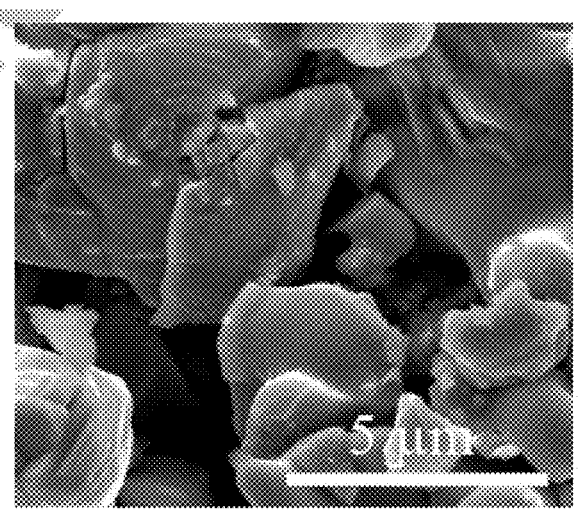
FIG. 7E  FIG. 7F

HIGH-PERFORMANCE TERBIUM-BASED THERMOELECTRIC MATERIALS

RELATED APPLICATION(S)

This application is a continuation-in-part application of U.S. Non-Provisional application Ser. No. 15/604,618, filed May 24, 2017 which claims the benefit of U.S. Provisional Application No. 62/340,663, filed May 24, 2016, which are incorporated herein by reference.

GOVERNMENT INTEREST

This invention was made with government support under ECCS1407650 and DMR1121252 awarded by the National Science Foundation. The government has certain rights in the invention.

BACKGROUND

Thermoelectric (TE) power generation can be considered one of the most promising and emerging clean energy conversion technologies. TE harvests energy from waste heat or natural heat without producing any direct emissions of greenhouse gases. In other words, TE materials are capable of transforming a temperature gradient into electrical power directly without any moving parts due to the underlying Seebeck effect. Absence of moving parts makes TE devices attractive for applications such as automobiles, solar thermoelectric generators, woodstove, diesel power plants, etc. Conversion of waste heat into energy without generating greenhouse gases makes TE devices an environmentally friendly energy option.

The thermal to electrical conversion efficiency of thermal electrical (TE) materials is quantified by a dimensionless number called figure of merit (ZT) which is determined by $S^2 T\sigma/\kappa$ where S, $\sigma$, $\kappa$, and T are the Seebeck coefficient, electrical conductivity, thermal conductivity, and absolute temperature, respectively. In order to obtain a high figure of merit, a TE material should possess a high Seebeck coefficient, high electrical conductivity, low resistivity, and low thermal conductivity. High electrical conductivity and low resistivity can allow for a reduction in the required joule heating. Low thermal conductivity can allow for a higher temperature gradient between a hot end and relatively lower temperature location of the TE material. These are typically contrasting requirements which usually require compromise.

Although there are materials such as tellurium based, antimony based, and germanium based compounds whose figure of merit is greater than 1; these materials are limited in practical application due to their unstable nature and toxicity. Furthermore, at high temperatures (e.g. temperatures at or above about 800K) these materials tend to degrade and/or evaporate. Such instability can limit their application to environments that have low operating temperatures (e.g. typically below about 450K). Thus, there is a need for TE materials which are not so limited in useful temperature range, are air stable, non-toxic, and exhibit a high figure of merit.

SUMMARY

A thermoelectric material can have formula (I), $$Tb_xM1_{y-x}M2_zO_w \qquad (I)$$

where M1 is one of Ca, Mg, Sr, Ba and Ra, M2 is at least one of Co, Fe, Ni, and Mn, x ranges from 0.01 to 5; y is 1, 2, 3, or 5; z is 1, 2, 3, or 4; and w is 1, 2, 3, 4, 5, 7, 8, 9, or 14 and where the material is air stable within 5% mass for one year and non-toxic.

In another embodiment a thermoelectric system can include the thermoelectric material and a pair of electrodes. The thermoelectric material can have a figure of merit (zT) which is a function of temperature such that zT>0.5 for temperatures greater than 350 K and zT>1.0 for temperatures greater than 700 K, is non-toxic, and is air-stable within 5% mass over one year. The pair of electrodes can be electrically associated with the thermoelectric material at locations remote from one another forming a temperature differential zone.

In a further embodiment a method of making a polycrystalline thermoelectric material is disclosed. In one example the method can include (i) combining stoichiometric amounts of powder $M1_yO_u$, $M2_zO_v$, and $Tb_xO_t$ to form a homogenous powder, (ii) grinding the homogenous powder, (iii) calcinating the homogenous powder at a first temperature ranging from 500° C. to 700° C. for a period of time ranging from 1 min to 1 hour, and (iv) compacting the calcinated homogenous powder at a pressure ranging from 10 MPa to 80 MPa to form a compacted polycrystalline thermoelectric material. In one example, M1 is one of Ca, Mg, Sr, Ba and Ra, M2 is at least one of Co, Fe, Ni, and Mn, t ranges from 0.0175 to 8.75; u ranges from 1 to 5; v ranges from 1 to 6; x ranges from 0.01 to 5; y is 1, 2, 3, or 5; z is 1, 2, 3, or 4; and w is 1, 2, 3, 4, 5, 7, 7, 8, 9, or 14. The polycrystalline thermoelectric material can have a formula $Tb_xM1_{y-x}M2_zO_w$.

There has thus been outlined, rather broadly, the more important features of the invention so that the detailed description thereof that follows may be better understood, and so that the present contribution to the art may be better appreciated. Other features of the present invention will become clearer from the following detailed description of the invention, taken with the accompanying drawings and claims, or may be learned by the practice of the invention.

BRIEF DESCRIPTION OF THE DRAWINGS

For a fuller understanding of the nature and advantage of the present invention, reference is being made to the following detailed description of embodiments in connection with the accompanying drawings, in which:

FIG. 7A-F illustrates SEM images of a $Tb_{0.5}Ca_{2.5}Co_4O_9$ pellet at different magnifications in accordance with one example of the present disclosure;

Figure 1:
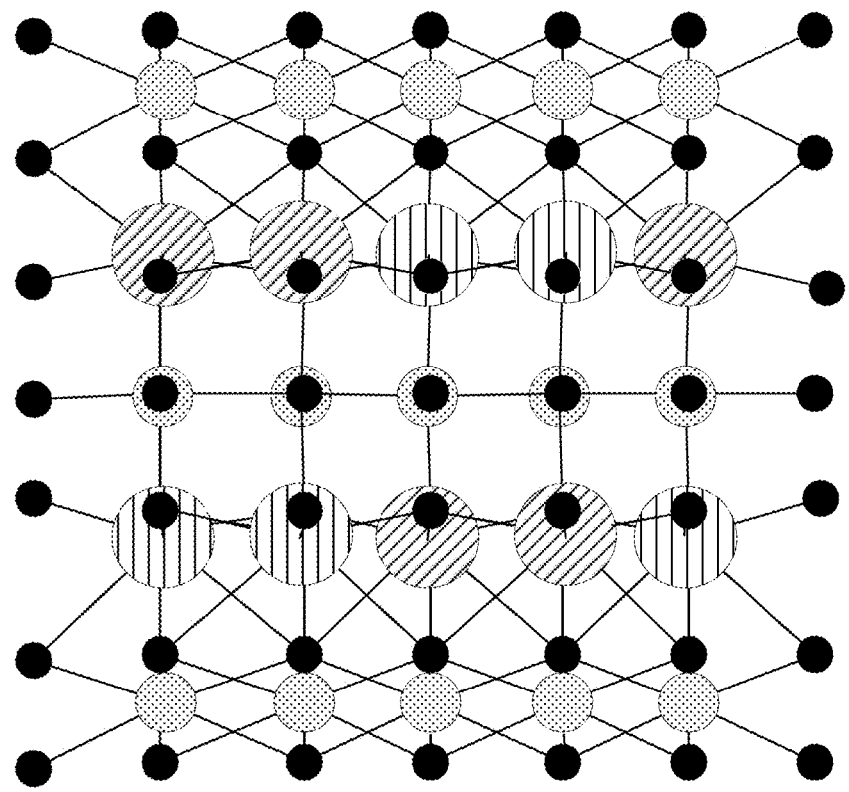
FIG. 1 is a schematic illustrating an exemplary crystal structure having the formula $Tb_xM1_{y-x}M2_zO_w$, such as $Tb_{0.5}Ca_{2.5}Co_4O_9$, in accordance with one aspect of the present disclosure.
Figure 1:
Figure 1:
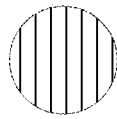
Figure 1:

These drawings are provided to illustrate various aspects of the invention and are not intended to be limiting of the scope in terms of dimensions, materials, configurations, arrangements or proportions unless otherwise limited by the claims.

DETAILED DESCRIPTION

While these exemplary embodiments are described in sufficient detail to enable those skilled in the art to practice the invention, it should be understood that other embodiments may be realized and that various changes to the invention may be made without departing from the spirit and scope of the present invention. Thus, the following more detailed description of the embodiments of the present invention is not intended to limit the scope of the invention, as claimed, but is presented for purposes of illustration only and not limitation to describe the features and characteristics of the present invention, to set forth the best mode of operation of the invention, and to sufficiently enable one skilled in the art to practice the invention. Accordingly, the scope of the present invention is to be defined solely by the appended claims.

Definitions

In describing and claiming the present invention, the following terminology will be used.

The singular forms "a," "an," and "the" include plural referents unless the context clearly dictates otherwise. Thus, for example, reference to "a particle" includes reference to one or more of such materials and reference to "subjecting" refers to one or more such steps.

As used herein, the term "about" is used to provide flexibility and imprecision associated with a given term, metric or value. The degree of flexibility for a particular variable can be readily determined by one skilled in the art. However, unless otherwise enunciated, the term "about" generally connotes flexibility of less than 5%, and most often less than 1%, and in some cases less than 0.01%.

As used herein, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that, which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term in this specification, like "comprising" or "including," it is understood that direct support should be afforded also to "consisting essentially of" language as well as "consisting of" language as if stated explicitly and vice versa.

As used herein, comparative terms such as "increased," "decreased," "better," "worse," "higher," "lower," "enhanced," and the like refer to a result achieved from a component or a combination of components, that is measurably different from a result achieved from the component, a substitute component, or another combination of components.

As used herein with respect to an identified property or circumstance, "substantially" refers to a degree of deviation that is sufficiently small so as to not measurably detract from the identified property or circumstance. The exact degree of deviation allowable may in some cases depend on the specific context.

As used herein, "adjacent" refers to the proximity of two structures or elements. Particularly, elements that are identified as being "adjacent" may be either abutting or connected. Such elements may also be near or close to each other without necessarily contacting each other. The exact degree of proximity may in some cases depend on the specific context. When elements are referenced as "directly adjacent" the elements are contacting each other.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

As used herein, the term "at least one of" is intended to be synonymous with "one or more of." For example, "at least one of A, B and C" explicitly includes only A, only B, only C, and any combinations of these such as A and B; A and C; B and C; and A, B, and C.

Concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a numerical range of about 1 to about 4.5 should be interpreted to include not only the explicitly recited limits of 1 to about 4.5, but also to include individual numerals such as 2, 3, 4, and sub-ranges such as 1 to 3, 2 to 4, etc. The same principle applies to ranges reciting only one numerical value, such as "less than about 4.5," which should be interpreted to include all of the above-recited values and ranges. Further, such an interpretation should apply regardless of the breadth of the range or the characteristic being described.

Any steps recited in any method or process claims may be executed in any order and are not limited to the order presented in the claims. Means-plus-function or step-plus-function limitations will only be employed where for a specific claim limitation all of the following conditions are present in that limitation: a) "means for" or "step for" is expressly recited; and b) a corresponding function is expressly recited. The structure, material or acts that support the means-plus function are expressly recited in the description herein. Accordingly, the scope of the invention should be determined solely by the appended claims and their legal equivalents, rather than by the descriptions and examples given herein.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Generally a thermoelectric (TE) material is disclosed herein. In one example the TE material can include a material having the formula (I)

$$Tb_xM1_{y-x}M2_zO_w \qquad (I)$$

where M1 is one of calcium (Ca), magnesium (Mg), strontium (Sr), barium (Ba) and radium (Ra); M2 is at least one of cobalt (Co), iron (Fe), nickel (Ni), and manganese (Mn); x ranges from 0.01 to 5; y is 1, 2, 3, or 5; z is 1, 2, 3, or 4; and w is 1, 2, 3, 4, 5, 6, 7, 8, 9, or 14.

In one example the TE material can be air stable within 5% mass over a year. As used herein, air stable means that the TE material does not evaporate or degrade in ambient conditions to an extent that produces a percent reduction in the total mass (in weight %) over a specified period of time. As used herein, "ambient conditions" refers to room temperature environments (about 20° C. to about 27° C.) and relative humidity (about 40% to 50% humidity). In yet other examples the TE material can be air-stable within 4% mass, within 3% mass, within 2% mass, within 1% mass, or within 0.5% mass over one year. In some aspects the material can be air stable without a protective coating. In one example air stability can be maintained indefinitely, and at least within 5% of initial performance (e.g. conversion efficiency) over one year, and most often within 1% of initial performance.

In other examples the TE material disclosed herein can be non-toxic. As used herein non-toxic means that the TE material satisfies the standards set forth by OECD protocols TG 401, 402 and 403, dated 1987 and revised August 2016.

In one example the TE material disclosed herein can be a doped material starting with the starting formula $M1_yM2_zO_w$. The doping agent disclosed herein can be terbium (Tb) ions. The terbium ions can displace a portion of the M1 element in the starting formula. Terbium ions can be a good doping agent because these ions can have an ionic size close to the ionic size of the M1 element. For example terbium ions can have an average ionic size of 106-90 pm and calcium ions, one of the potential M1 elements, can have an average ionic size of 100 pm. Substituting a portion of the M1 element with ions of similar size can allow for more of the ions to be introduced into the lattice structure of the material before causing precipitation than would be incorporated utilizing ions that do not have a similar ionic size, such as heavy trivalent rare-earth metals. TE materials that incorporate heavy trivalent earth-metals can also cause scattering of phonons and reduce the thermal conductivity of the TE material and thereby have other disadvantages.

By incorporating terbium into the starting formula the concentration of holes in the starting material can decrease which in turn can increase the value of the Seebeck coefficient and can provide a high figure of merit. For example terbium doped $Ca_3Co_4O_9$ can exhibit a figure of merit (ZT) of 0.74 at 800 K. An exemplary lattice structure for a TE material as shown herein is provided in FIG. 1.

Turning now to the structure of formula I shown below.

$$Tb_xM1_{y-x}M2_zO_w \qquad (I)$$

In one example of this formula, x can be 0.01 to 5; y can be 1, 2, 3, or 5; z can be 1, 2, 3, or 4; and w can be 1, 2, 3, 4, 5, 7, 8, 9, or 14. In another example $0.2 \leq x \leq 0.8$, $0 < y \leq 5$, $1 < z < 4$, and $1 \leq w \leq 14$. In yet a further example, y, z, and w can be any values that provide a stable material and x can be any value greater than 0 and less than y. In yet another example x can be equal to or less than 0.5.

In formula I M1 can be one of calcium (Ca), magnesium (Mg), strontium (Sr), barium (Ba), and radium (Ra). In one example M1 can be calcium. In yet another example M1 can be magnesium. In one example M1 can be only one of Ca, Mg, Sr, Ba, and Ra, and formula I can exclude the other elements. For example, if M1 is Ca, then formula can exclude Mg, Sr, Ba, and Ra.

In formula I M2 can be at least one of cobalt (Co), iron (Fe), nickel (Ni), and manganese (Mn). In one example M2 can be cobalt. The M2 elements can exhibit different oxidation states. For example, cobalt can be in an oxidation state of $Co^{1-}$, $Co^{1+}$, $Co^{2+}$, $Co^{3+}$, $Co^{4+}$, or a combination thereof. In one example M2 includes cobalt and the cobalt is in a $Co^{3+}$ or $Co^{4+}$ or a combination of those oxidation states. When M2 includes iron the iron can be in an oxidation state of $Fe^{2+}$, $Fe^{3+}$, or a combination thereof. In another example M2 can include nickel and the nickel can be in an oxidation state of $Ni^{1-}$, $Ni^{1+}$, $Ni^{2+}$, $Ni^{3+}$, $Ni^{4+}$, or a combination thereof. In yet another example M2 can include manganese and the manganese can be in the oxidation state of $Mn^{3-}$, $Mn^{2-}$, $Mn^{1-}$, $Mn^{2+}$, $Mn^{3+}$, $Mn^{4+}$, $Mn^{5+}$, $Mn^{6+}$, $Mn^{7+}$, or a combination thereof.

In formula I, the terbium can also have various oxidation states. For example the Tb ions can be in the oxidation state of $Tb^{3+}$, $Tb^{4+}$, $Tb^{9+}$, or a combination thereof. With respect to the amount of Tb ions in formula I, the Tb ions can be incorporated in any amount that is greater than 0 and less than the amount of M1. In one example in formula I x can range from 0.01 to 5. In another example x can range from 0.01 to 0.7. In yet other examples x can range from 0.01 to 3, from 0.1 to 4, from 0.5 to 2, from 0.25 to 4.5, from 0.01 to 0.95, from 0.05 to 0.8, or the like. In one example Tb can be incorporated at up 0.5 without causing any precipitation of any impurity phase. As a general rule, impurities can be limited to less than 0.1%, and most often less than 0.05%.

In some examples incorporation of the Tb can also decrease the concentration of M2 ions corresponding to a decrease in the holes in the material. The reduction in hole concentration can give rise to a larger Seebeck coefficient, while enhanced phonon scattering caused by heavier Tb ions can result in lower thermal conductivity. The combined higher Seebeck coefficient and low thermal conductivity can result in a TE material that has a high figure of merit. As used herein, a high figure of merit means a material having a ZT at above 2 as determined at 800 K, and most often above 0.5.

The starting material for forming the TE material can be any combination of elements chosen from M1 and M2 and any oxidation states for M2. For example the starting material can be $Ca_3Co_4O_9$, $CaCoO_3$, $BrNiO_3$, $Ba_2CoO$, $Mg_2Mn_2O_3$, $SrFeO_2$, $Ra_2Mn_2O_7$, and the like.

In one specific example the starting material is $Ca_3Co_4O_9$ and formula I is $Tb_{0.5}Ca_{2.5}Co_4O_9$. A TE material having this formula can have a Seebeck coefficient of between 300 $\mu VK^{-1}$ to 350 $\mu VK^{-1}$, can have an electrical conductivity ranging from about 140 S/cm to about 170 S/cm, can have a thermal conductivity ranging from about 1 W/m-K to about 1.5 W/m-K, can have a power factor ranging from about 1.4 mW/m·$K^2$ to about 1.8 mW/m·$K^2$ and can have a figure of merit ranging from about 0.70 to about 1.1 all at a temperature of 800 K. In another example a TE material having this formula can have a figure of merit of 0.74 at 800 K. In other examples a TE material having this formula can have a figure of merit of 1.02 at 800 K or 1.04 at 800 K and can be stable in air. In yet another example, the material can have an electrical conductivity of 155.27 S/cm, Seebeck coefficient of 323 $\mu V/K$, thermal conductivity 1.24 W/m-K, power factor of 1.62 mW/m·$K^2$, and figure of merit 1.04 at 800 K.

In some examples the TE material can be a polycrystalline material. In general polycrystalline materials are known to exhibit a weaker thermoelectric response than the same material in a single crystal form. However, single crystal form TE materials can be limited in application because single crystals cannot be readily utilized in large scale applications.

In another example the TE material can be a single layer material (aka monolithic). In a further example the TE material can be a multi-layered material. In some examples, added layers can decrease the performance of the TE material; therefore a monolithic material may most often be desired. While not being limited to a particular theory it is believed that this decrease may occur as a result of a decline in the temperature gradient across the material.

In an alternative example, the material can be porous. As used herein porosity refers to voids in a TE material. The number average pore size of individual voids can most often vary from 0.5 µm to 2 µm. The distribution of the pores can generally be random and in some cases can be a network of porous channels. A highly porous TE material can have a higher internal stress than a less porous version of the same TE material. Accordingly, pores in the material can affect the conversion efficiency of the material.

The porosity can also be varied depending on desired performance. Porosity can generally be nano-porous to microporous. Porosity can also range from about 1% to about 50%, although other ranges may be suitable. For example the porosity range can be from about 5% to 50%, from about 1% to about 45%, from about 5% to about 30%, from about 10% to about 40%, or from about 15% to about 45%.

In one example, a porous thermoelectric material can be formed by using a sacrificial filler material during formation. The sacrificial filler material can be any material that can be removed after formation of the thermoelectric material. For example, volatilizable components such as, but not limited to, wood, polymer, carbon, and nano structures or the like can be mixed with the starting materials and then burned away or removed during processing leaving a porous structure.

The TE materials described herein can be prepared as bulk materials. In some aspects, the material can be used as a bulk thermoelectric material with no other layers, additives, or components.

The dimensions of a TE bulk material can be determined as suitable for the desired application. For example, thicknesses from about 5 mm to about 10 mm can be readily achieved across a relatively large surface area on the order of centimeters. In yet other examples the thickness can range from about 1 mm to about 50 mm, about 2 mm to about 20 mm, about 5 mm to about 15 mm, about 1 mm to about 25 mm, or from about 2 mm to about 8 mm. In one example, length and widths can range from about 0.5 cm to about 15 cm. In yet other examples the length and width can range from about 1 cm to about 10 cm, about 0.5 to about 8 cm, about 5 cm to about 15 cm, or from about 3 cm to about 12 cm. These sizes are merely exemplary. There is no theoretical limitation to functional sizes.

In some examples the TE material can exclude other oxide layers. In one example the TE materials can exclude a substrate material. In some examples the material can exclude adhesive layers. Thus, in one example, the material can have a structure that is operable to be directly connected to a pair of electrodes with no intervening material. As long as a temperature differential is present across the material with respect to the electrode locations, current can be produced. When added, the electrodes can be formed of any suitable conductive material. Non-limiting examples of suitable conductive material can include, copper, silver, gold, aluminum, nickel, other metals, ITO, conductive polymers, alloys thereof, and the like. In one example, Au or Ag electrodes can be utilized and can be bonded directly to the thermoelectric material.

Further presented herein is a thermoelectric system. In one example the thermoelectric system can include a thermoelectric material as described herein, and a pair of electrodes electrically associated with the thermoelectric material. The thermoelectric material can have a zT which is a function of temperature such that zT>0.5 for temperatures greater than 350 K and zT>1.0 for temperatures greater than 700 K. The thermoelectric material can also be non-toxic, and can be air-stable within 5% mass over one year and in some cases within 1% mass over one year. The pair of electrodes are electrically associated with the thermoelectric material at locations remote from one another forming a temperature differential zone between the electrodes.

Figure 2:
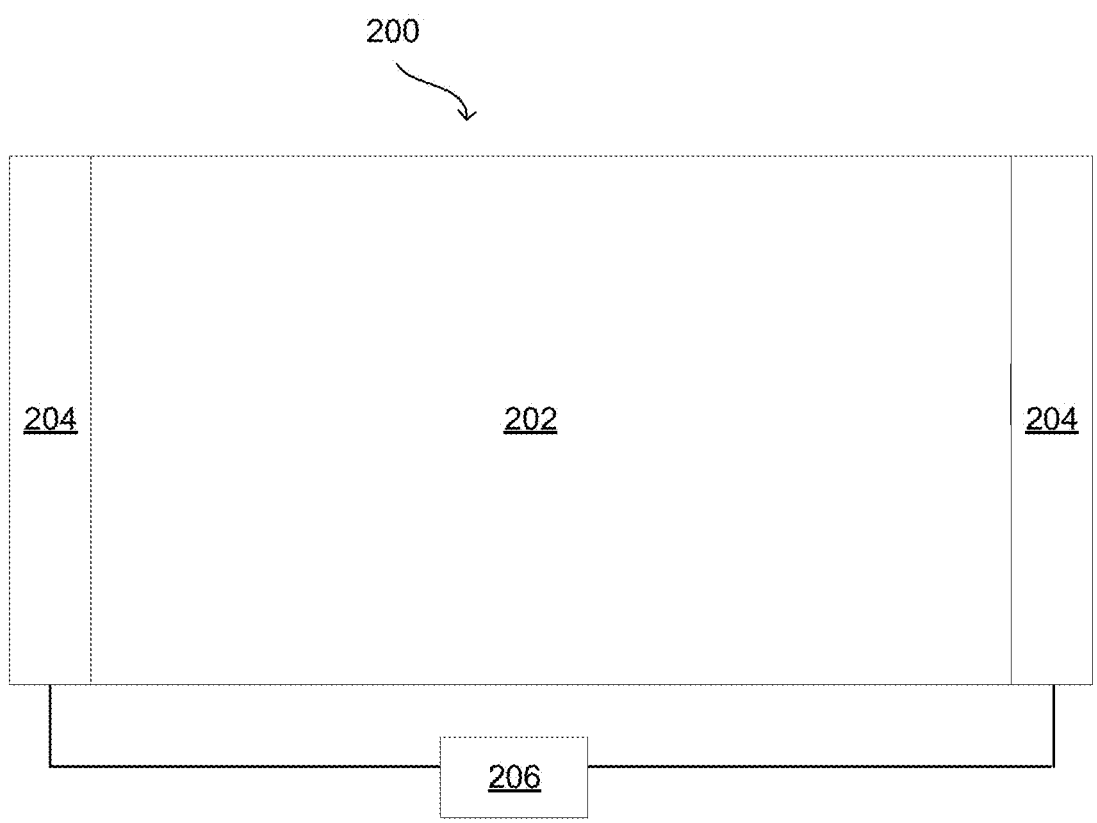
FIG. 2 is a schematic illustrative of a thermoelectric system, in accordance with one aspect of the present disclosure.

An exemplary thermoelectric system can be seen in FIG. 2 where 200 is the thermoelectric system including the thermoelectric material 202, and electrodes 204 oriented on opposite sides of the thermoelectric material. Notably, the thermoelectric system can be operated to produce electricity or create a temperature differential across the thermoelectric material. In one option, when a temperature differential exists (e.g. a heat source) electricity is generated and can be stored or used by power unit 206. In this case, the power unit can be a battery to store electricity or an electronic device. Non-limiting examples of heat sources can include automobile brakes, engine exhaust manifolds, engine blocks, industrial boilers, chemical reactors, heating plates, air resistive heating such as in aircrafts, human body temperature, and the like.

Alternatively, power unit 206 can be configured to operate as a power delivery mechanism which applies a potential across the pair of electrodes 204. In such a case, a temperature differential is created across the thermoelectric material which can be used to heat and cool opposite sides. For example, the thermoelectric system can operate as a cooling unit where heat is driven toward one electrode causing a cooling affect at the opposite electrode.

Figure 3:
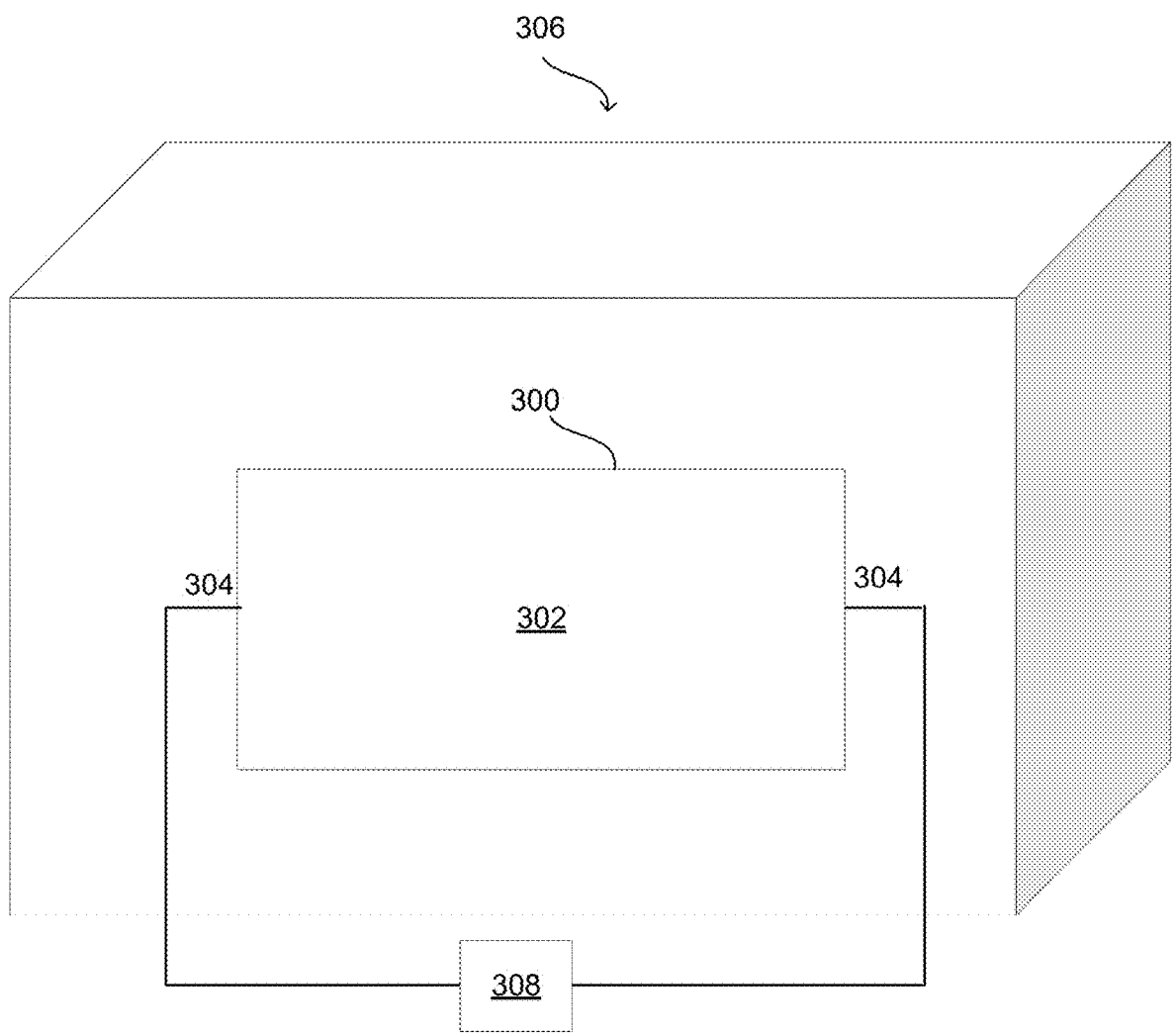
FIG. 3 is a schematic illustration of thermoelectric system on a heat generating device, in accordance with one aspect of the present disclosure.

The thermoelectric material can be as described above. In one example the electrodes can be any conductive material such as, but not limited to, copper, silver, gold, aluminum, nickel, other metals, ITO, conducting polymers, or a combination thereof. In some examples the electrodes can be directly connected to the thermoelectric material without any intervening material. A thermoelectric system can be attached to a heat generating device, such as, an automobile, boiler, wood stove, or other industrial or residential heat source, as shown in FIG. 3. In FIG. 3 the thermoelectric system 300, having a TE material 302 and electrodes 304 is attached to the exterior of a heat generating device 306. The electrodes can be electrically connected to a corresponding power unit 308 as with the example illustrated in FIG. 2. Thus, the power unit can operate as either a battery to store electricity generated by the thermoelectric system 300 and/or provide electricity to generate a temperature differential across the TE material 302.

Further presented herein is a method of making a polycrystalline thermoelectric material. In one example, the method can include combining stoichiometric amounts of powder $M1_yO_u$, $M2_zO_v$, and $Tb_xO_t$ to form a homogenous powder; grinding the homogenous powder; calcining the homogenous powder at a first temperature ranging from 500° C. to 700° C. for a period of time ranging from 1 min to 1 hour; and compacting the calcined homogenous powder at a pressure ranging from 10 MPa to 80 MPa to form compacted pellets. M1 can be one of Ca, Mg, Sr, Ba and Ra, M2 can be at least one of Co, Fe, Ni, and Mn, t ranges from 0.0175 to 8.75; u ranges from 1 to 5; v ranges from 1 to 6; x ranges from 0.01 to 5; y is 1, 2, 3, or 5; z is 1, 2, 3, or 4; and w is 1, 2, 3, 4, 5, 7, 8, 9, or 14. The polycrystalline thermoelectric material can have a formula $Tb_xM1_{y-x}M2_zO_w$.

Figure 4:
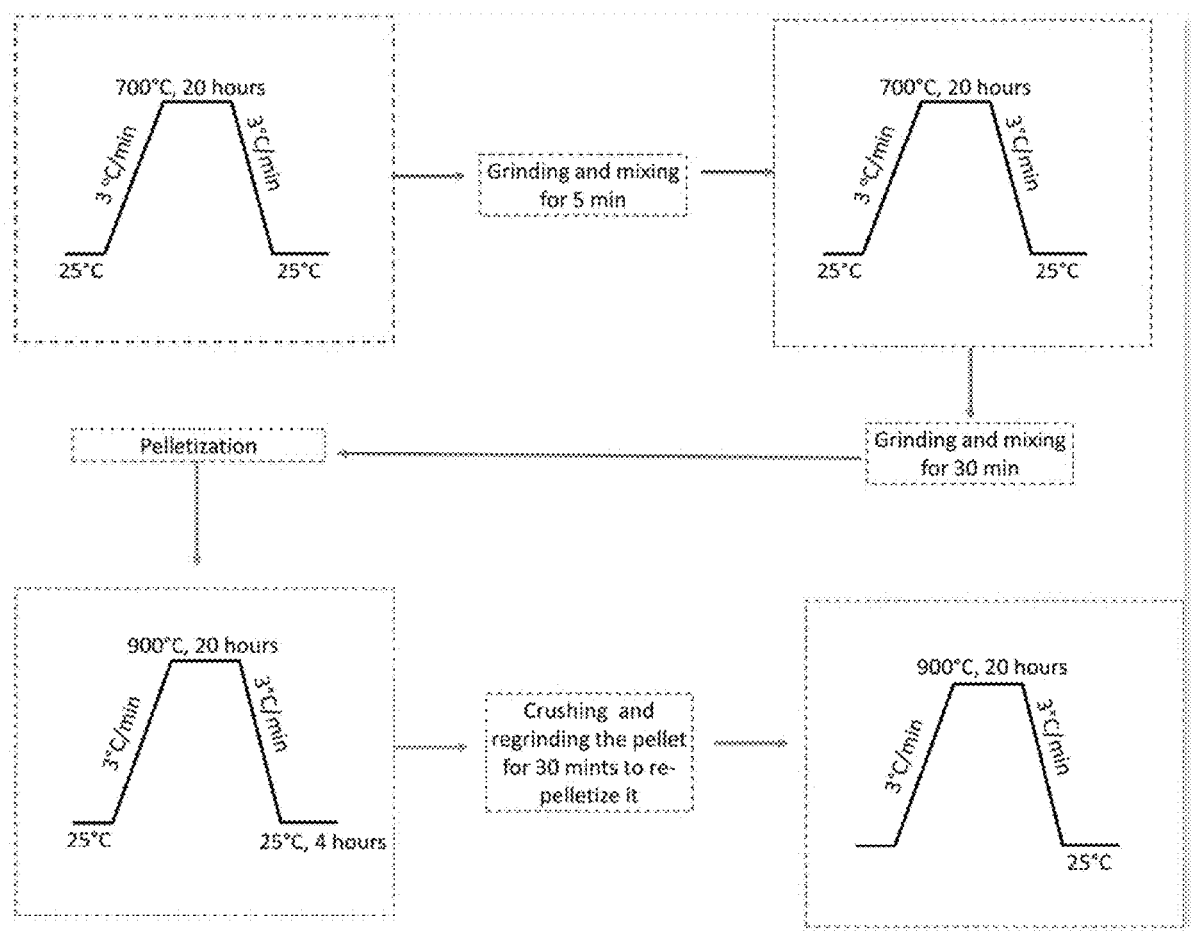
FIG. 4 is a process flow diagram illustrating exemplary heating and cooling cycles of calcinating, grinding, and sintering processes that can be used to synthesize a $Tb_{0.5}Ca_{2.5}Co_4O_9$ pellet in accordance with one example of the present disclosure.

In one example the method can further include grinding the calcined homogenous powder to form a ground calcined homogenous powder, and further calcining the ground homogenous powder at a second temperature ranging from at least 25° C. higher than the first temperature for a period of time ranging from about 2 hours to about 24 hours prior to compacting the calcining homogenous powder. In one example the method can include multiple calcining and grinding cycles. An exemplary multiple cycle method is shown in FIG. 4.

In yet another example the method can further include sintering the compacted pellets at a temperature ranging from 1000 K to 1500 K for a period of time ranging from 10 hours to 30 hours.

In another example the method can further include combining a sacrificial filler material, as described above, when combining stoichiometric amounts of powder M1yOu, $M2_zO_v$, and $Tb_xO_t$ to form a homogenous powder. The sacrificial filler material can be burned off during calcining, and/or sintering. Incorporating the sacrificial filler material can allow for the formation of voids in the final formed TE material such that porosity and performance can be controlled. For example, the relative proportion of sacrificial filler material can be varied as previously discussed.

In some examples the method can include a two-step heating process. The first step can include heating to a first temperature and the second step can have a higher temperature than the first temperature in the first step. The sacrificial filler material, if included in this two-step variation, can be burned off during the second step.

In one example the processing conditions can form the thermoelectric material without using an integrated substrate. Thus, the material can be formed as an independent material during processing and subsequently.

The resultant TE material can be as described above. In one example the TE material is a polycrystalline thermoelectric material that can have a formula $Tb_{0.5}Ca_{2.5}Co_4O_9$.

Thus has been outlined the discovery of a new oxide based thermoelectric material that is doped with terbium, a system incorporating that material, and a method of making that material. The operational temperature for the TE materials disclosed herein can range across any temperature at which the material is stable. However, operational temperature can generally range from about 300 K to 1200 K, and in many cases from 500 K to 900 K. Similarly, a ZT value of at least 0.7, and in some cases at least 0.9, at 800 K can be achieved, while a ZT of at least 0.6 at 700 K can also be achieved with these materials. In some cases, a lower ZT can be useful when relatively low voltage (e.g. pico or microwatt) production is desired. For example, a ZT of from 0.08 to 0.5 can be suitable for body temperature applications. The materials of the present invention can also have a ZT greater than about 0.08 at room temperature, and in some cases from about 0.08 to about 0.2.

The thermoelectric materials can be suitable for use in a wide array of applications such as, but in no way limited to, biosensors, wearable technology, automotive industry (recapture of waste heat), industrial waste heat recovery, and the like. Furthermore, through application of a current, the thermoelectric materials can be used to cool a surrounding environment.

EXAMPLES

Example 1: Thermoelectric Material Development and Performance Testing

Sample Preparation.

Figure 5:
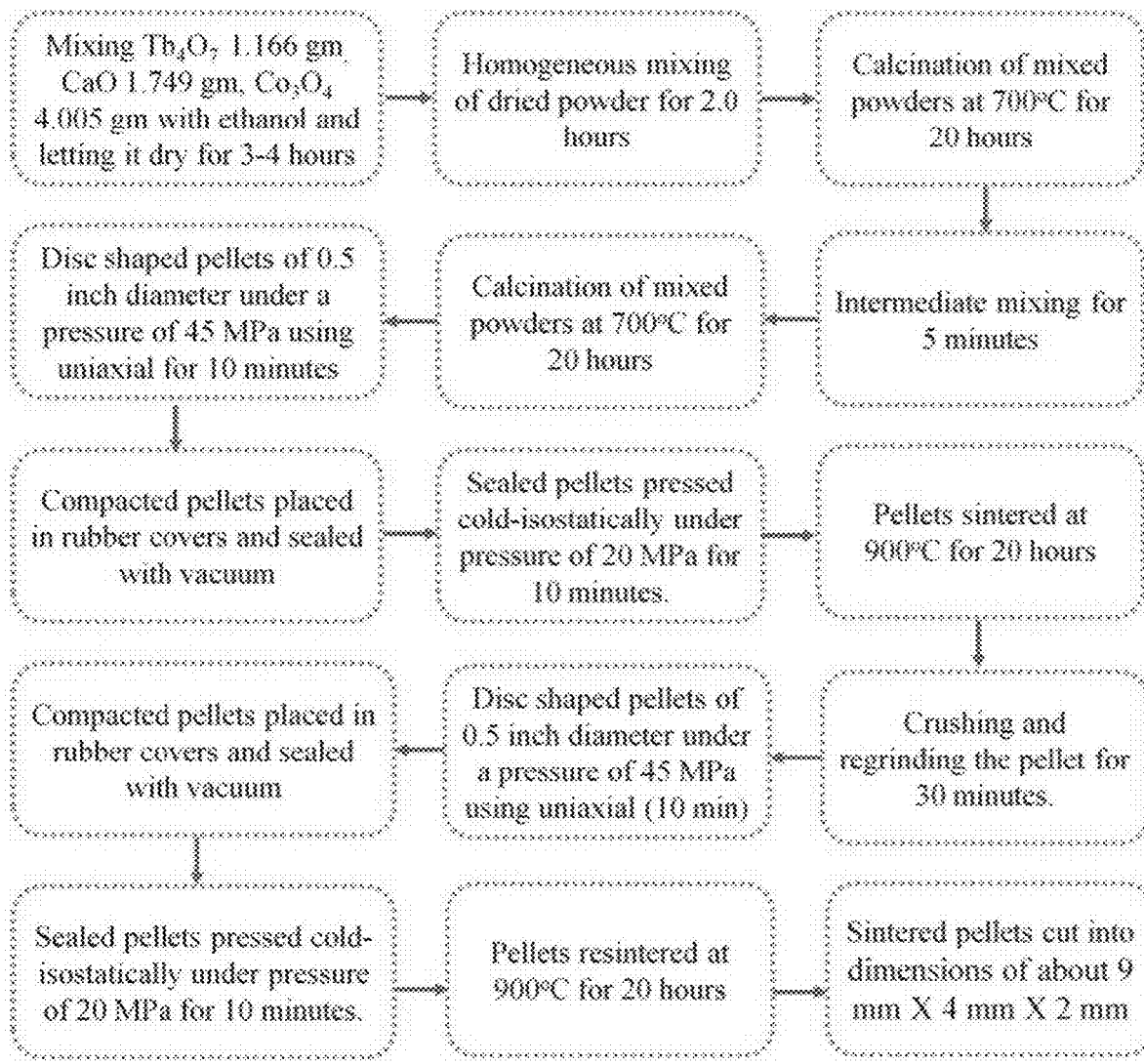
FIG. 5 is a flow diagram illustrating an exemplary method utilized to prepare a TE material in accordance with one example of the present disclosure.

As outlined in FIG. 5, polycrystalline ceramic samples of $Ca_{3-x}Tb_xCo_4O_9$ with x=0-0.7 ($Ca_3Tb_{0.00}Co_4O_9$, $Ca_{2.99}Tb_{0.01}CO_4O_9$, $Ca_{2.97}Tb_{0.03}CO_4O_9$, $Ca_{2.95}Tb_{0.05}CO_4O_9$, $Ca_{2.9}Tb_{0.1}CO_4O_9$, $Ca_{2.7}Tb_{0.3}CO_4O_9$, $Ca_{2.5}Tb_{0.5}CO_4O_9$, $Ca_{2.4}Tb_{0.6}CO_4O_9$, $Ca_{2.3}Tb_{0.7}Co_4O_9$) were prepared by solid state reaction technique. Stoichiometric amounts of Calcium oxide (CaO, Alfa Aesar, 99.9%), Cobalt oxide ($Co_3O_4$, Alfa Aesar, 99.7%) and Terbium oxide ($Tb_4O_7$, Alfa Aesar, 99.9%) were mixed together to obtain a homogenous powder. The resulting powder was then calcined twice at 973 K for 20 hours with intermediate grinding steps. Calcining can generally be performed in air, although other oxygen environments. The powder was then compacted into 0.5 inch diameter pellets under a pressure of 45 MPa using a uniaxial press. The compacted pellets were further compressed iso-statically under a pressure of 200

MPa to obtain high and uniform density pellets. Later, the pellets were sintered at a temperature of 1173 K for 20 hours, with re-pelletizing and sintering procedures repeated twice. Finally, the sintered pellets were shaped into rectangular shaped samples of dimensions 10 mm×4 mm×2 mm to perform various characterization experiments.

Characterizations.

X-Ray diffraction (XRD) experiments were performed using Philips X'Pert diffractometer with Cu $K_\alpha$ radiation. Micro-structural characterization was performed using an FEI Quanta 600 FEG scanning electron microscope (SEM). The SEM images obtained were used to determine the grains and their distribution. The transmission electron microscopy (TEM) including selected area electron diffraction pattern (SAED) and energy dispersive spectroscopy (EDS) was performed using a high-resolution JEOL 2800 S/TEM. The TEM specimens were prepared by ultra-sonication of the crushed powder in ethanol followed by drop casting on a Cu holey carbon grid. X-ray photoelectron spectroscopy (XPS) was performed using a Kratos Axis Ultra DLD system with a monochromatic Al $K_\alpha$ source (1486 eV). The component peaks were fitted using Casa XPS software to quantify the elemental composition of the samples. The electrical conductivity, Seebeck coefficient and thermal conductivity were measured over the temperature range 300 K to 800 K. For electrical conductivity measurements, 4-probe technique was employed in which a constant current was passed through the sample using a current source (KI 6220) and the resulting voltage was measured by a nano-voltmeter (KI 2182A). For Seebeck coefficient measurements, a temperature difference was established between the two ends of the sample and resulting voltage was measured using high-purity platinum wire. Thermal diffusivity was measured by laser flash technique using a pulsed excimer laser (Compex Pro). The heat capacity was measured using a Netzch DSC 3500 Sims differential scanning calorimeter. By using experimentally measured thermal diffusivity, specific heat and density, thermal conductivity of the samples was determined.

Results

Structural Characterization.

Figure 6:
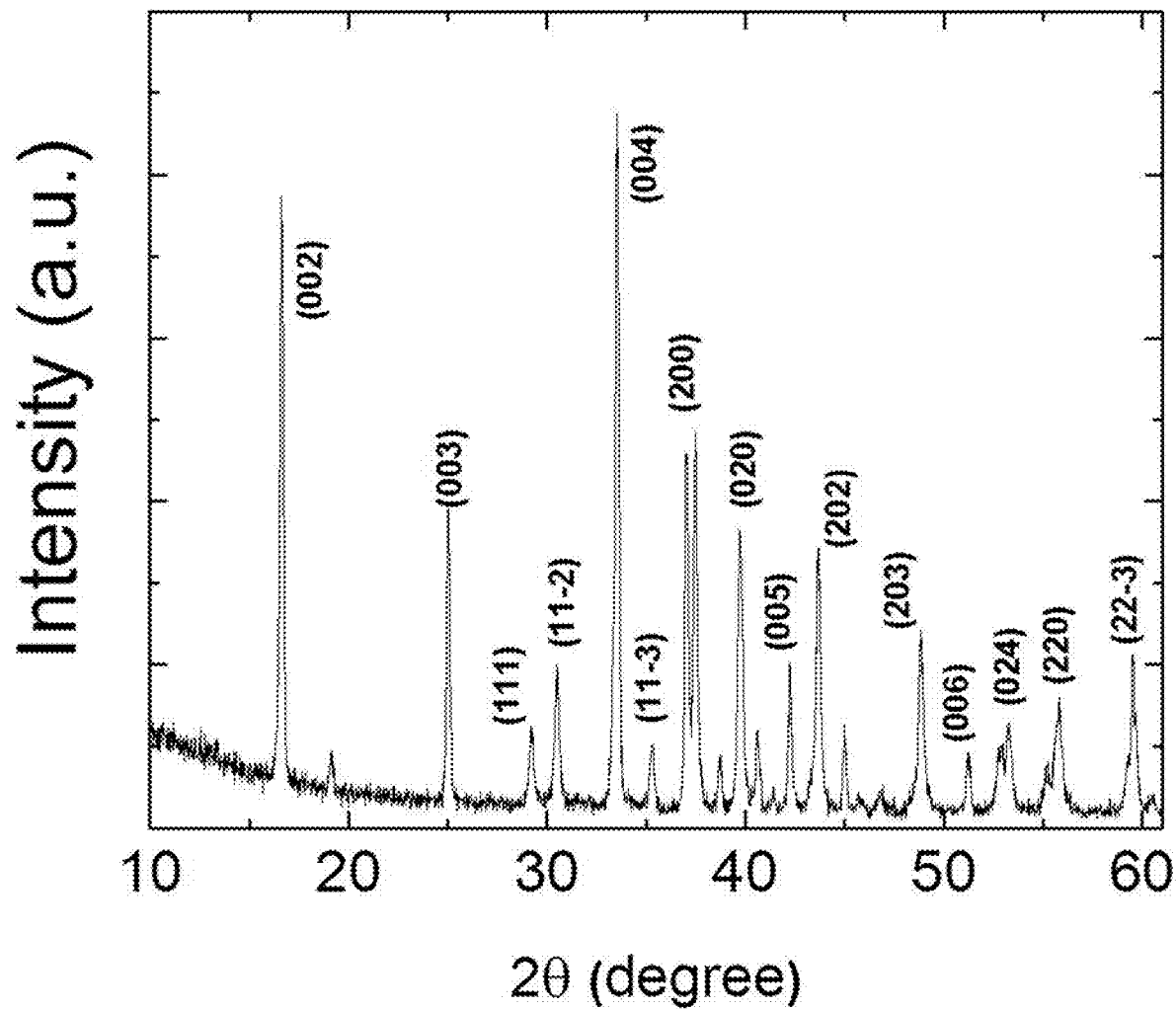
FIG. 6 is a graph of $\theta$-$2\theta$ XRD pattern of a $Tb_{0.5}Ca_{2.5}Co_4O_9$ pellet in accordance with one example of the present disclosure, in this figure polycrystalline grains are found and c-plane oriented grains are dominant.
Figure 8A:
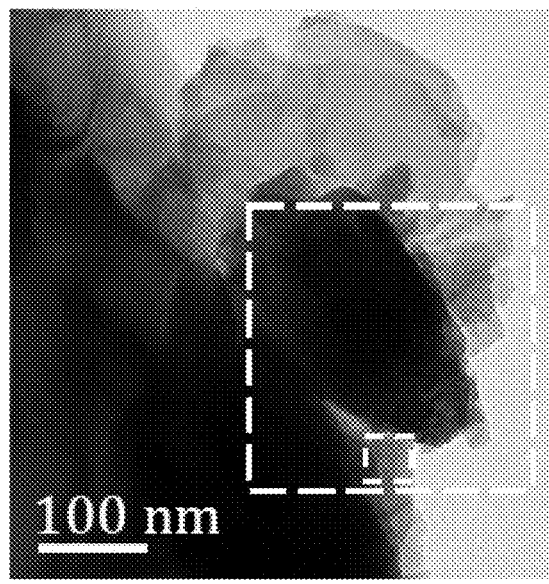
FIG. 8A is a TEM image of TCCO; the small enclosure indicates the area from where HRTEM was collected and the larger enclosure indicates the area where EDS mapping was performed.
Figure 8B:
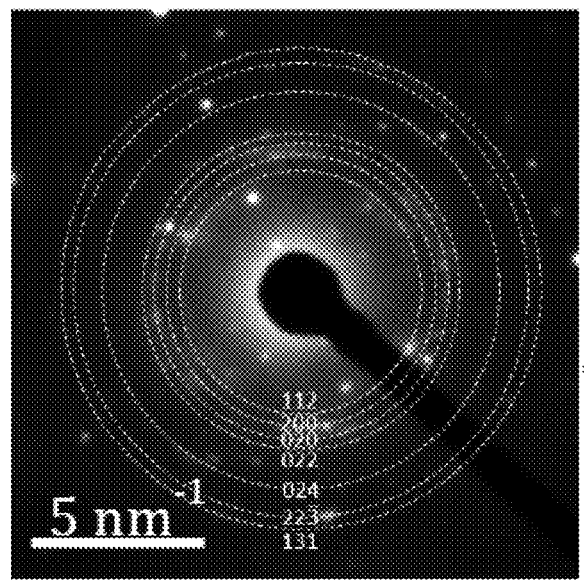
FIG. 8B is an SAED with index planes.
Figure 8C:
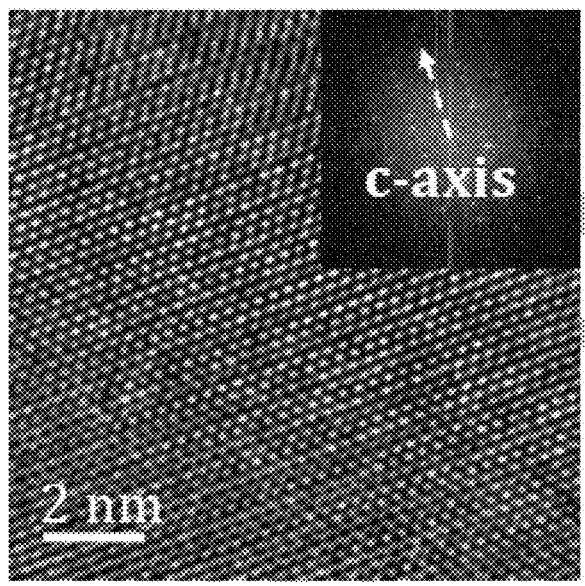
FIG. 8C is an HRTEM which shows the c-axis preferred orientation of the sample; inset is the FFT image.
Figure 8D:
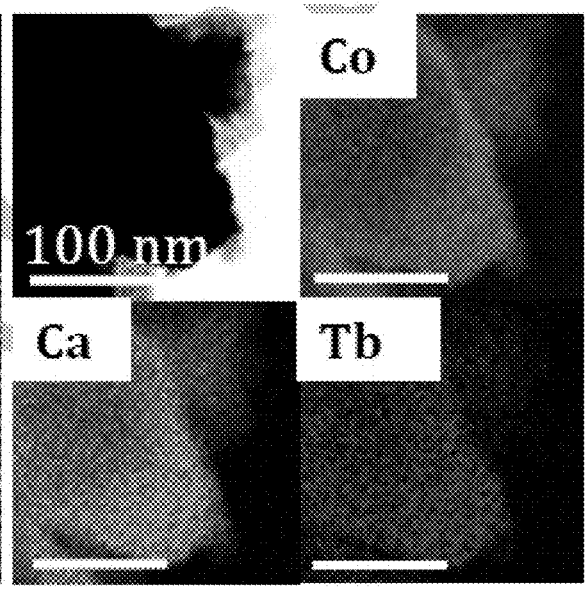
FIG. 8D is a BF-STEM and EDS mapping of element Ca, Co, and Tb indicating the uniform doping of Tb in the TCCO lattices.

The XRD patterns of the $Ca_{3-x}Tb_xCo_4O_9$ samples are shown in FIG. 6. The data has been plotted with an offset in y-axis for a better visibility. The XRD pattern of the undoped $Ca_3Co_4O_9$ sample shows all the characteristic peaks as reported in JCPDS database and previous reports. The pattern remains unchanged till x=0.5 except for a slight shift in the peak positions towards the higher angle side. This shift indicates a slight decrease in the lattice parameters, which is consistent with the slightly smaller size of Tb ions compared to $Ca^{2+}$ ion. On increasing the Tb content further, for x=0.6 sample the intensity of the (002) and (003) peaks diminishes un-proportionally while for the x=0.7 sample, few additional impurity peaks were detected (as marked in FIG. 2). These results indicate that x=0.5 is the maximum value of Tb content for which sample remains single phase.

SEM micrographs of x=0 and 0.5 samples are shown in FIG. 7. The x=0 sample showed micron-sized disk like grains which maintained their individuality without much connectivity between the grains. On the other hand, the grains of Tb-doped samples showed slightly fused structure with better connectivity between the grains. All the samples investigated showed relatively low density which was about 70% of the theoretical density.

TEM results for x=0 and 0.5 samples are shown in FIG. 8. In each case the top-left panel shows low magnification TEM image of the respective samples. The bottom-left panels show the high-resolution TEM (HR-TEM) images recorded from the areas marked with red broken lines in the low magnification TEM images. The insets show the Fast Fourier-transformed (FFT) patterns of the HRTEM images. The layered structure of the material with distinguished $CoO_2$ and RS layers can clearly be seen in HRTEM images. The top-right panels show the selected area electron diffraction (SAED) patterns recorded from the respective samples. Since grain sizes in the samples, as seen in SEM micrographs, were of the order of several micrometers, the SAED covered the area containing just few grains. As a result SAED showed speckled ring kind of pattern mixed with diffraction spots of single crystals. The bottom-right panels show the EDS elemental mapping images of Ca, Tb, Co and O in the respective samples. EDS images show the uniform distribution of elements over the whole area examined in the study.

X-Ray Photoelectron Spectroscopy.

Figure 9:
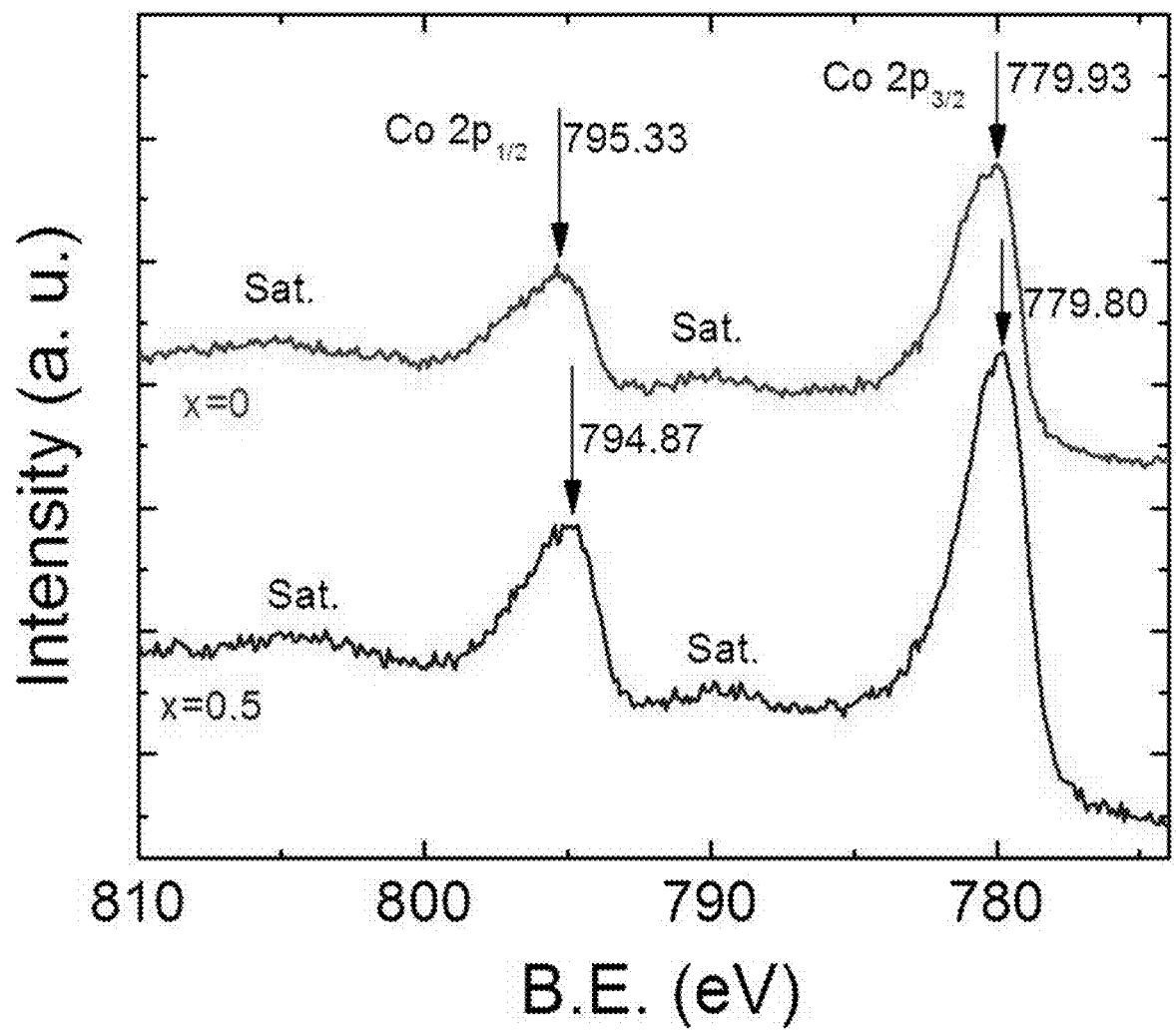
FIG. 9 is a graph of 2p XPS spectra of Co ions observed from x=0 and x=0.5 samples.

In order to find the ionic states of the constituent elements, XPS studies were performed. The 2p XPS spectra of Co ions observed from x=0 and x=0.5 samples is shown in FIG. 9. The Co $2p_{3/2}$ and $2p_{1/2}$ peaks for the undoped sample lies at 779.93 eV and 795.33 eV, respectively. In literature, it has been reported that for $Co^{3+}$ state, the $2p_{3/2}$ and $2p_{1/2}$ peaks occur at 779.6 eV and 794.8 eV, respectively, while for the $Co^{4+}$ state, the $2p_{3/2}$ and $2p_{1/2}$ peaks occurs at 781.4 eV and 796.8 eV, respectively. Since, observed binding energies lye in between the values expected for $Co^{3+}$ and $Co^{4+}$, it is inferred that the cobalt in the sample exists in the mixed $Co^{3+}/Co^{4+}$ valence state. In case of x=0.5 sample, Co $2p_{3/2}$ and $2p_{1/2}$ peaks are observed at 779.80 eV and 794.87 eV, respectively. Though this position is still in between the peaks expected for $Co^{3+}$ and $Co^{4+}$ but is closer to the peak expected for $Co^{3+}$. This indicates that in 0.5 Tb doped sample, the concentration of $Co^{4+}$ ions (and hence of holes) is smaller than that in the undoped sample.

Figure 10:
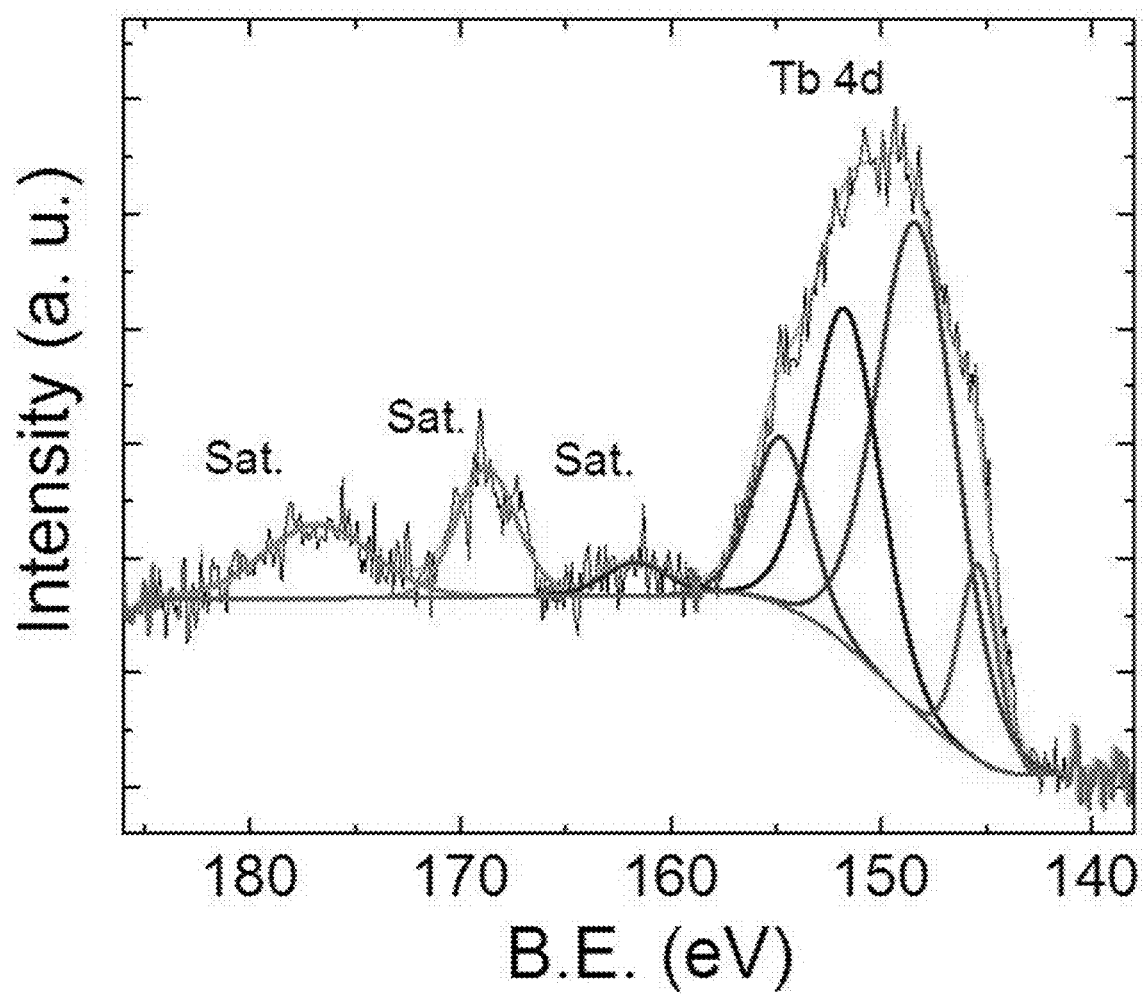
FIG. 10 is a graph of Tb 4d XPS spectrum.

In order to understand the observed change in the hole concentration on Tb doping, Tb 4d XPS spectrum was recorded (see FIG. 10). The observed spectrum comprised of a very broad peak indicating the multiplet splitting in the 4d band. On comparing the XPS data with the corresponding data reported in the literature, it was inferred that the Tb exists in the mixed valence state. The spectral lines in the range 145.4 eV to 148.3 eV arise from $Tb^{3+}$ while those in the range 151.7 eV to 154.8 eV from $Tb^{4+}$. Substitution of $Tb^{3+}/Tb^{4+}$ ions in place of $Ca^{2+}$ ions in $Ca_3Co_4O_9$ is expected to donate electrons which in turn can reduce the net concentration of holes in the system.

Figure 11:
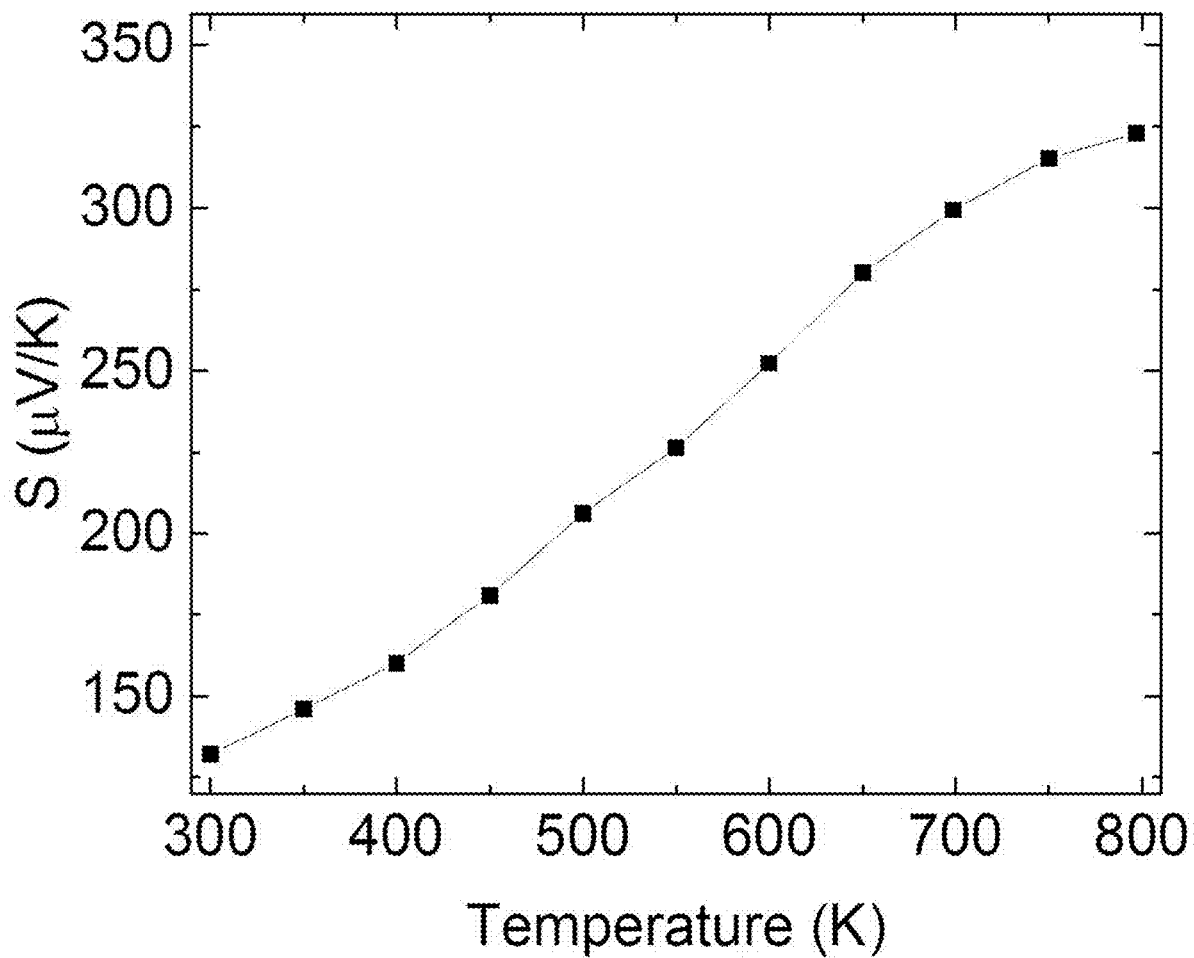
FIG. 11 is a graph of Seebeck coefficient versus temperature (S-T) of a $Tb_{0.5}Ca_{2.5}Co_4O_9$ pellet, in accordance with one example of the present disclosure.

Thermoelectric Characterization. The temperature dependence of Seebeck coefficient (S) from 300 K to 800 K for the samples is shown in FIG. 11. As can be seen the sign of the Seebeck coefficient is positive for all the samples indicating that holes are the dominant carriers in the materials. The value of the Seebeck coefficient of the undoped sample at room temperature was 46 $\mu V K^{-1}$. On introducing Tb in the system, the above value showed a continuous increase till x=0.5. This increase is consistent with the XPS results, which showed a decrease in the concentration of holes on Tb doping. On further increasing the value of x beyond 0.5, a sudden decrease in the Seebeck coefficient was observed. This decrease is in accordance with the XRD data which showed the formation of impurity phases for x>0.5. For all the samples, Seebeck coefficient showed a monotonous increase on increasing the temperature. The largest value of Seebeck coefficient ~323 $\mu V K^{-1}$ was observed for $Ca_{2.5}Tb_{0.5}Co_4O_9$ at 800 K.

Figure 12:
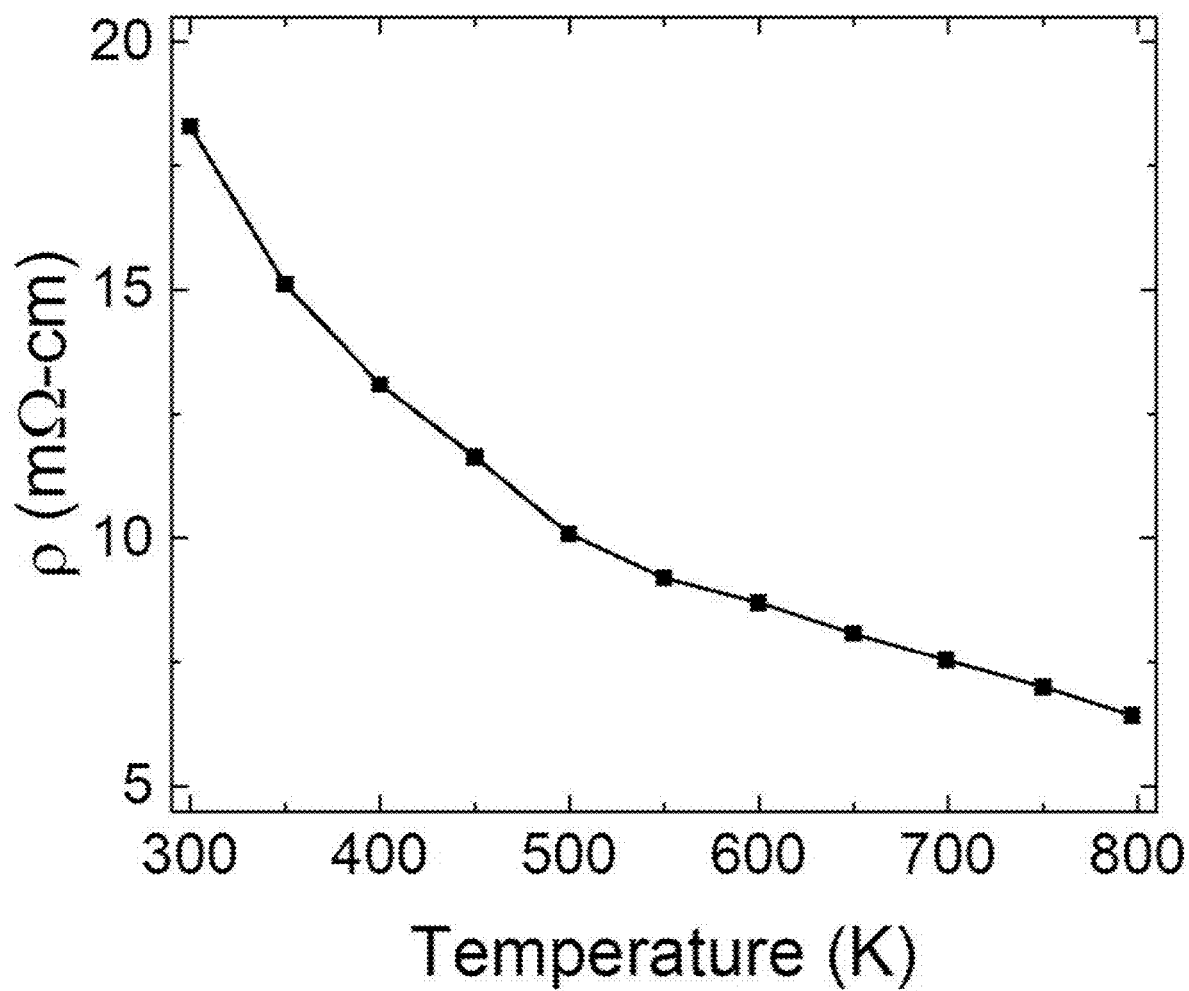
FIG. 12 is a graph of resistivity versus temperature (ρ-T) of a $Tb_{0.5}Ca_{2.5}Co_4O_9$ pellet, in accordance with one example of the present disclosure.

The electrical resistivity vs temperature data for all the samples is shown in FIG. 12. The overall electrical resistivity decreases with increase in temperature indicating a typical semiconducting-like behavior. Moreover, as the Tb-doping content is increased from x=0 to 0.5, the electrical resistivity first shows a decrease for x=0.01 and then increases monotonously. The initial decrease in the electrical resistivity (i.e. increase in electrical conductivity) is in contrast to XPS and Seebeck data, which indicated a reduction in the carrier concentration on introducing Tb in the system. Since electrical conductivity is related to the carrier concentration (n) and the carrier mobility (u) by the relation σ=neu, these results imply that Tb doping enhances the carrier mobility in the resulting system.

Figure 13:
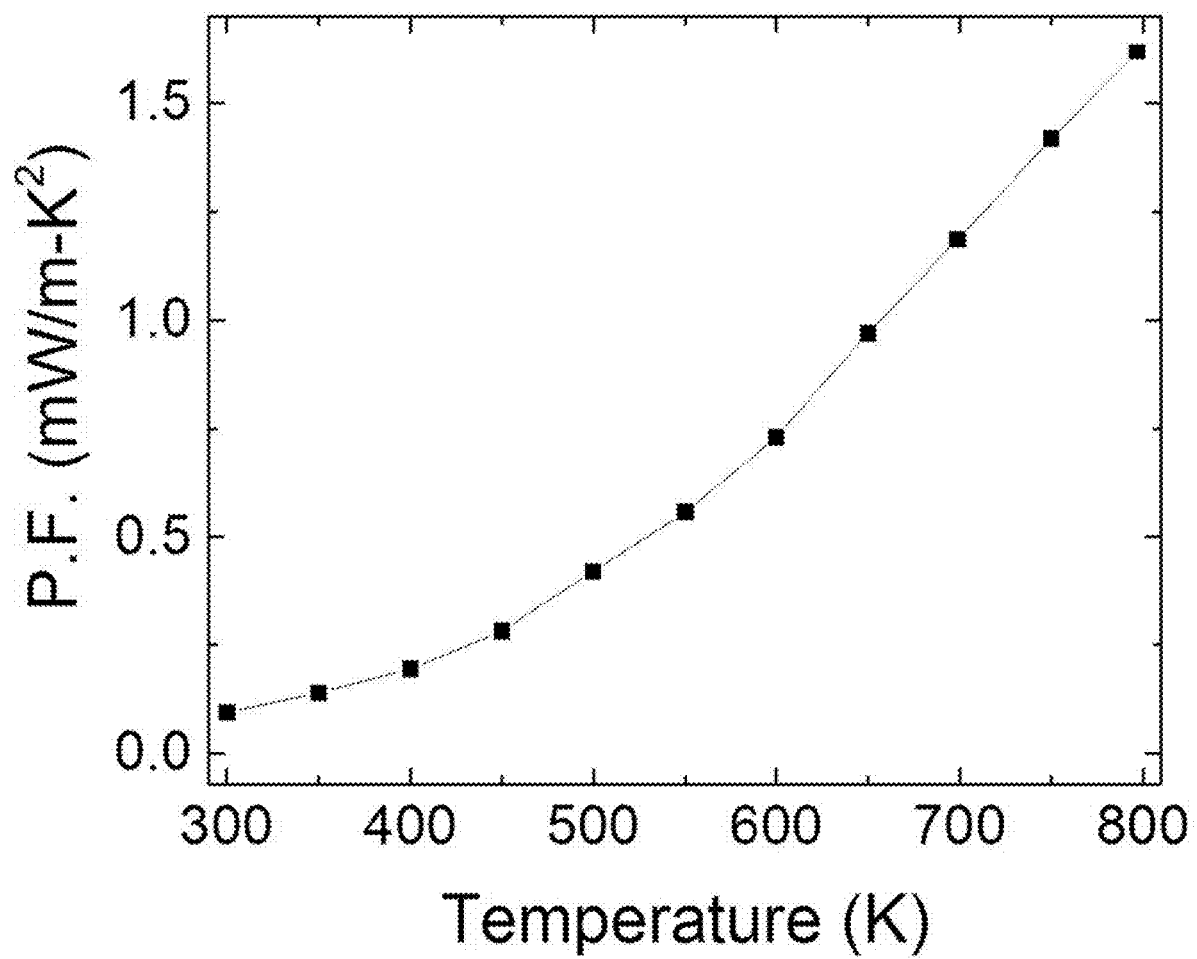
FIG. 13 is a graph of Power factor versus temperature (P.F-T) of a $Tb_{0.5}Ca_{2.5}Co_4O_9$ pellet, in accordance with one example of the present disclosure.

The increase in electrical resistivity for doping contents x=0.01 to 0.5, indicates that the decrease in the carrier concentration in this doping range is much more than the increase in the carrier mobility. On further increasing the Tb-doping content beyond x=0.5, the value of electrical resistivity increases suddenly. The above increase is consistent with the XRD data which showed the formation of impurity phases for x>0.5. In FIG. 13, the variation of power factor (PF=σ·S$^2$) with temperature for all the samples is shown. The x=0.5 sample shows a PF of 1.15 mW m$^{-1}$ K$^{-2}$ is at 800 K. This value is about 4 times higher than the corresponding value for the undoped sample.

Thermal Conductivity.

Figure 14:
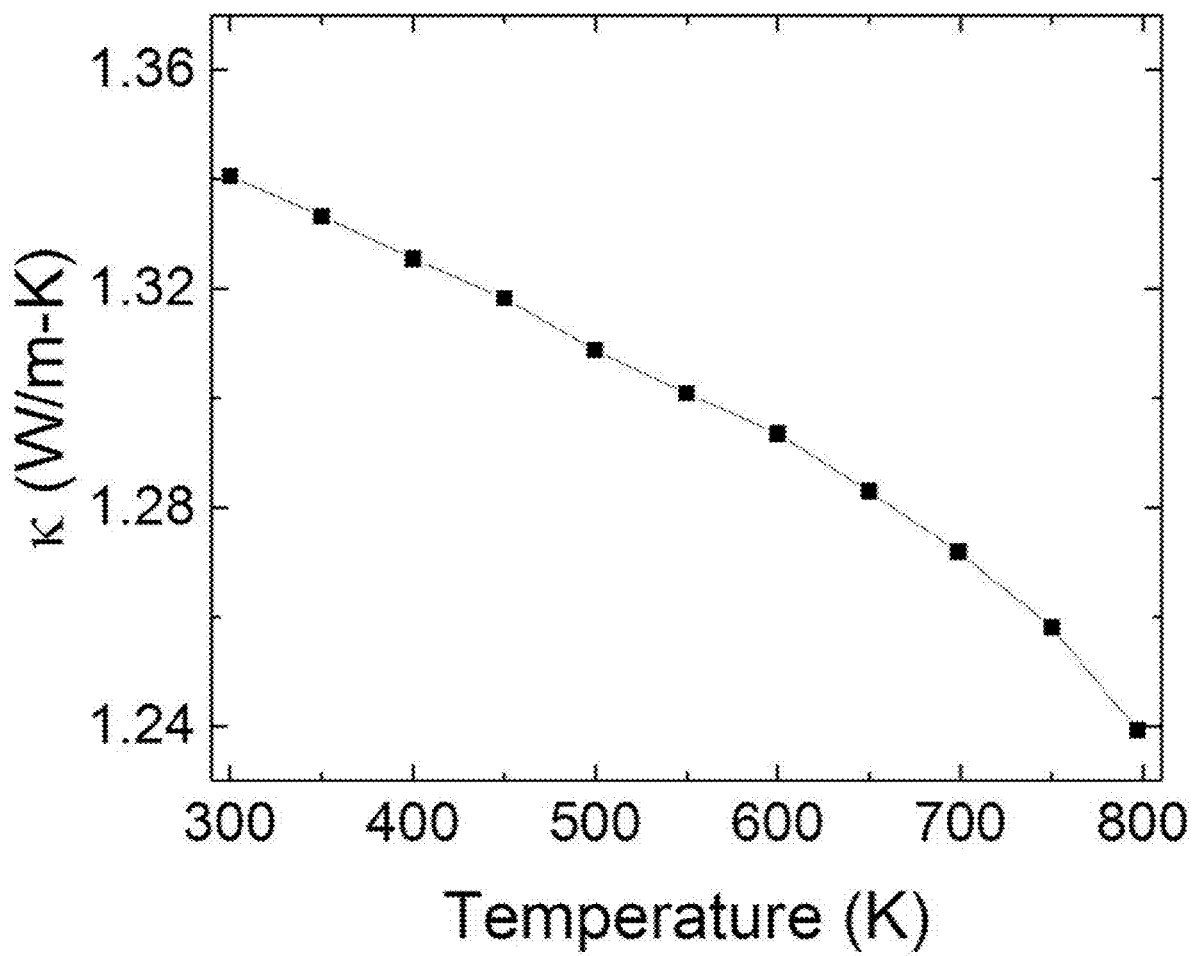
FIG. 14 is a graph of thermal conductivity versus temperature (κ-T) a $Tb_{0.5}Ca_{2.5}Co_4O_9$ pellet, in accordance with one example of the present disclosure.
Figure 15:
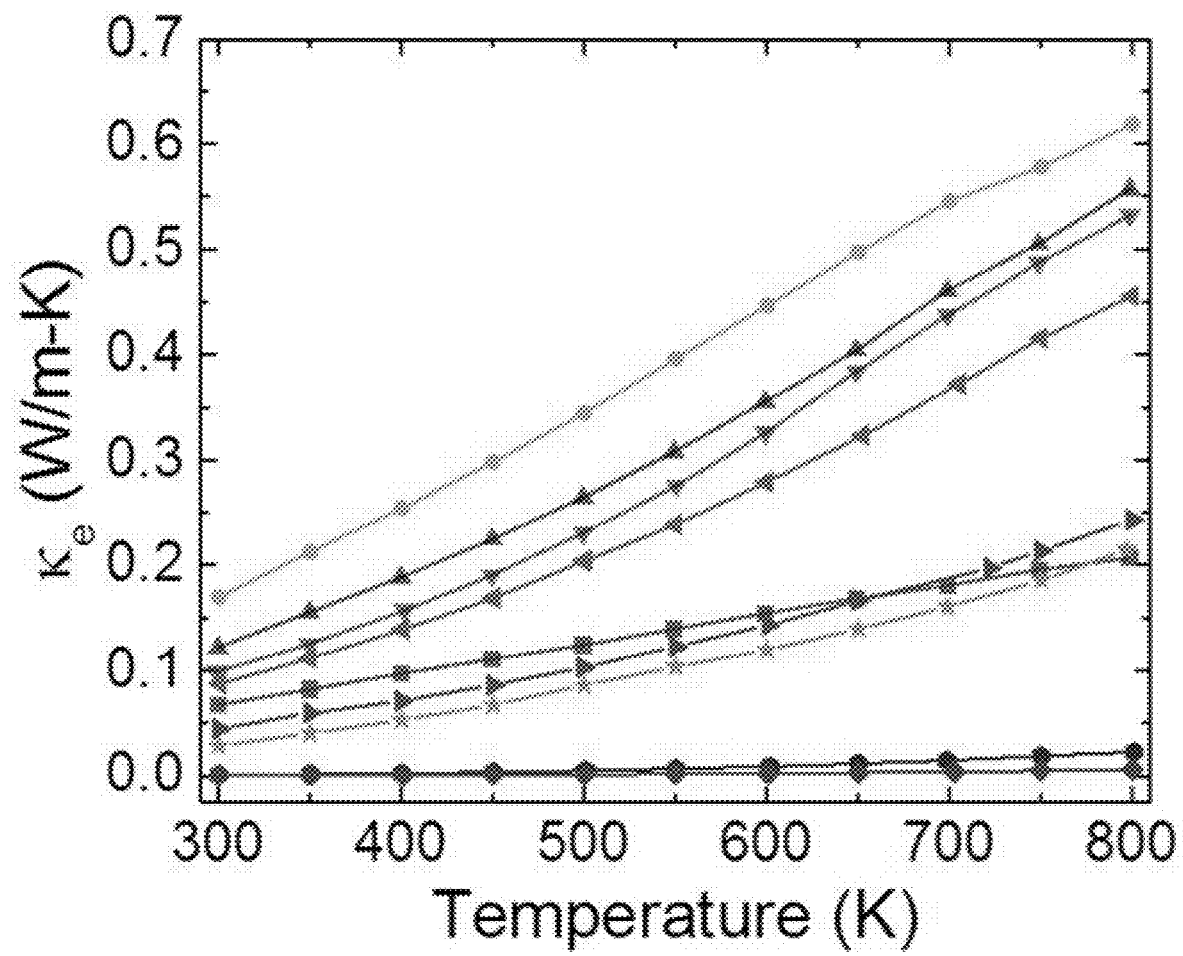
FIG. 15 is a graph of $κ_e$ determined using the experimentally measured σ values in the Wiedemann-Franz law versus temperature ($κ_e$-T)
Figure 16:
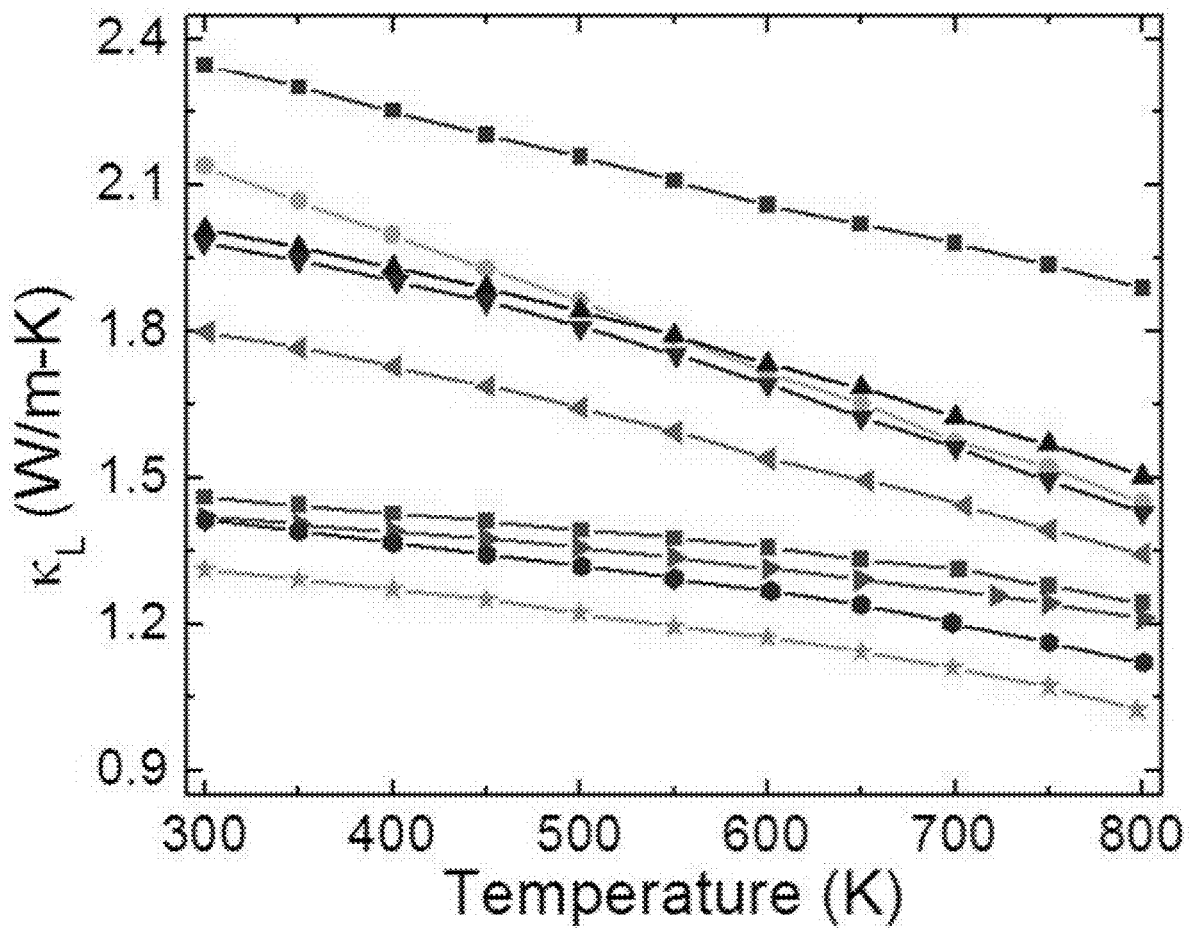
FIG. 16 is a graph of lattice thermal conductivity versus temperature ($κ_L$-T)

Total thermal conductivity (κ) of the samples was measured by laser flash technique and is shown in FIG. 14. For the x=0.0 sample, the value of κ at room temperature ($κ_{RT}$) was 2.41 Wm$^{-1}$K$^{-1}$. On increasing the Tb content, the value of $κ_{RT}$ decreased to 1.34 Wm$^{-1}$K$^{-1}$ for x=0.5. On further increasing the Tb content, $κ_{RT}$ was found to increase slightly for the x=0.6 and x=0.7 samples. For all the samples, the value of κ decreases monotonously with increase in temperature. In order to understand the dominant mechanism responsible for the observed variation in the thermal conductivity, the electronic ($κ_e$) and lattice ($κ_L$) components of the thermal conductivities were separated individually. FIG. 15 shows the values of $κ_e$ determined using the experimentally measured a values in the Wiedemann-Franz law: $κ_e$=L×σ×T where, L is the Lorentz number (2.44×10$^{-8}$ W·Ω·K$^{-2}$). By subtracting the value of $κ_e$ from κ, the value of $κ_L$ was determined as per the relation: $κ_L$=κ−$κ_e$ and is shown in FIG. 16. As can be seen on increasing the value of x, the value of $κ_e$ first increases for x=0.01 and then starts decreasing while the value of $κ_L$ shows a monotonous decrease. However, over the entire temperature range of our study the value of $κ_L$ is much higher than that of $κ_e$. As a result total thermal conductivity shows a decrease with increase in x.

Figure 17:
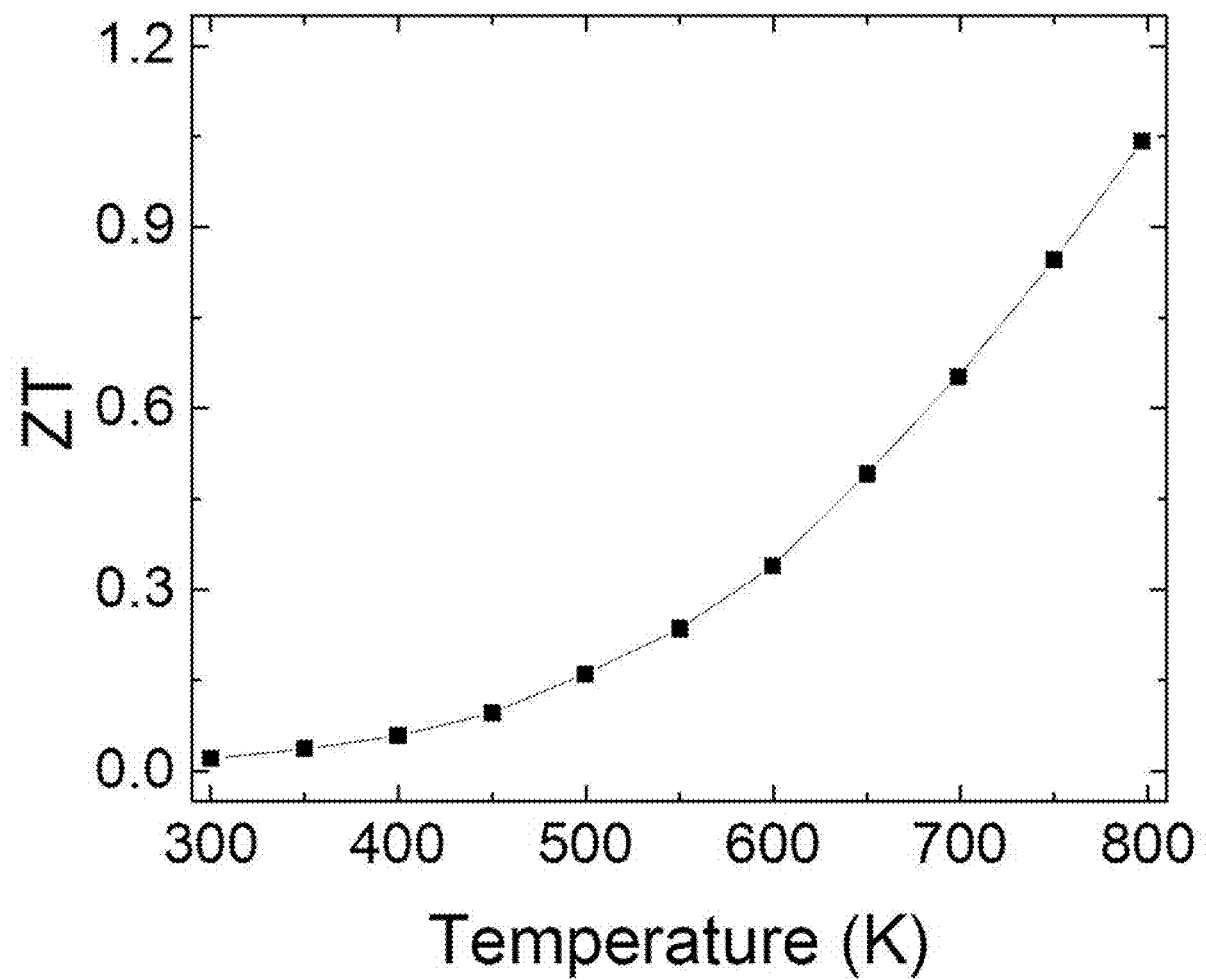
FIG. 17 is a graph of Figure of merit versus temperature (zT-T) for a $Tb_{0.5}Ca_{2.5}Co_4O_9$ pellet, in accordance with one example of the present disclosure.
Figure 18A:
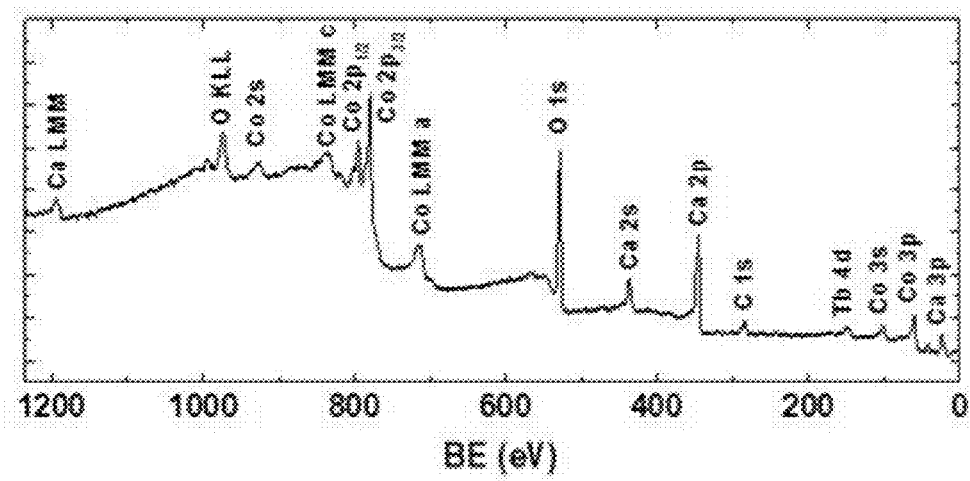
FIG. 18A-E are spectra of the samples of FIG. 17.
Figure 18B:
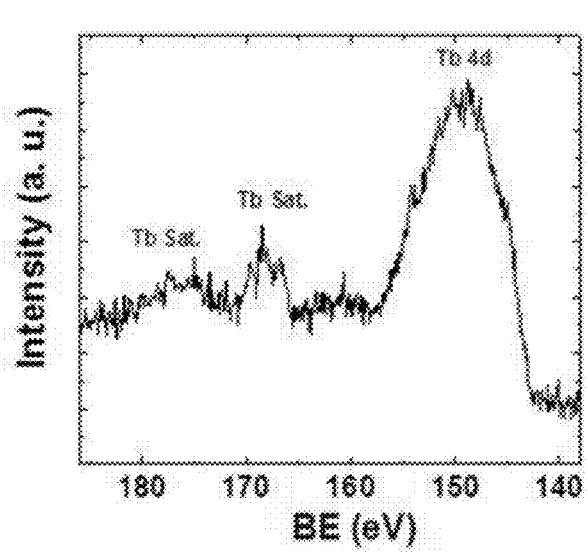
Figure 18C:
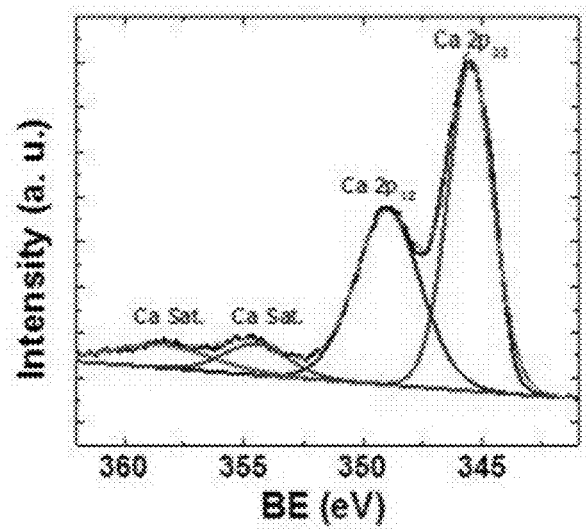
Figure 18D:
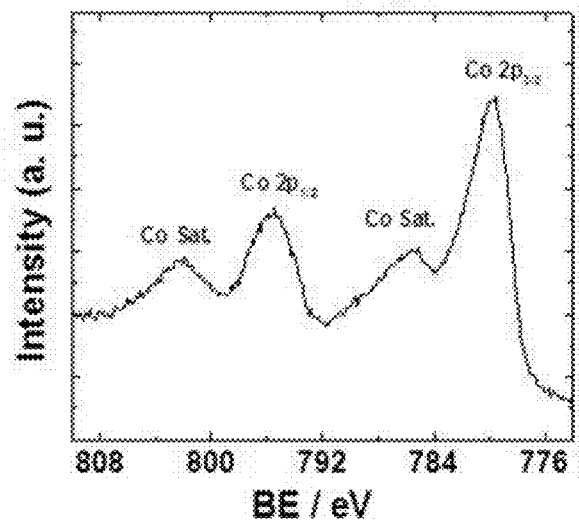
Figure 18E:
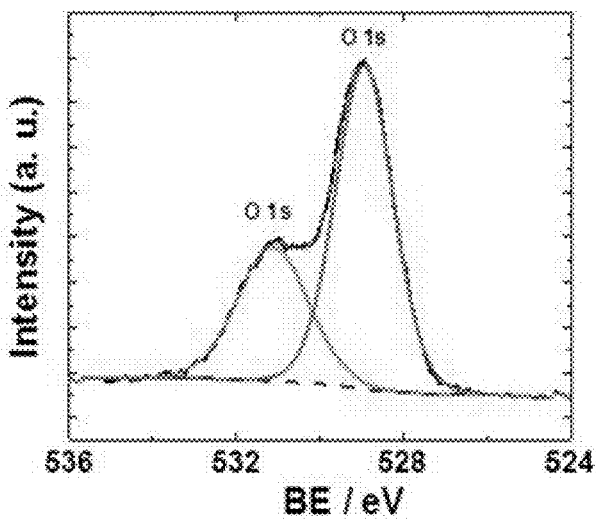

Using the experimentally measured 'S', 'σ' and 'κ' values the figure of merit was calculated. The temperature dependence of ZT for all the samples is shown in FIG. 17. The ZT for the undoped sample at room temperature was 2.3×10$^{-3}$ which increased to 0.12 at 800 K. On doping Tb in the system, ZT value first increased till x=0.5 and then started decreasing. For all the samples, ZT showed an increase with increase in temperature. The x=0.5 sample showed the highest value of ZT attaining a value of 0.74 at 800 K. Furthermore, spectra for all of the samples is also shown in FIG. 18A-E with FIG. 18B-E showing expanded views of sections of spectra in FIG. 18A.

SUMMARY

In summary, the maximum concentration of Tb that can be incorporated in the material without causing the precipitation of any impurity phase is x=0.5. It was observed that Tb doping causes a reduction in the relative concentration of Co$^{4+}$ ions which corresponds to a decrease in the concentration of holes in the material. Reduction in the hole concentration gives rise to a larger 'S' while enhanced phonon scattering caused by the heavier Tb ions results in lower 'κ'. Because of high 'S' and low 'κ', a high figure of merit of 0.74 at 800 K was observed for the x=0.5 sample. The enhanced figure of merit at high temperatures of about 800 K along with good air stability makes Tb doped Ca$_3$Co$_4$O$_9$ a strong candidate for next generation thermoelectric module applications.

The foregoing detailed description describes the invention with reference to specific exemplary embodiments. However, it will be appreciated that various modifications and changes can be made without departing from the scope of the present invention as set forth in the appended claims. The detailed description and accompanying drawings are to be regarded as merely illustrative, rather than as restrictive, and all such modifications or changes, if any, are intended to fall within the scope of the present invention as described and set forth herein.

What is claimed is:

1. A thermoelectric material, comprising a material having formula (I)

$$Tb_xM1_{y-x}M2_zO_w \qquad (I)$$

where M1 is one of Ca, Mg, Sr, Ba and Ra, M2 is at least one of Co, Fe, Ni, and Mn, x ranges from 0.01 to 5; y is 1, 2, 3, or 5; z is 1, 2, 3, or 4; and w is 1, 2, 3, 4, 5, 7, 8, 9, or 14;

wherein the material includes Tb having an oxidation state of Tb$^{3+}$, Tb$^{4+}$, and Tb$^{9+}$; and wherein the material is air stable within 5% mass for one year and is non-toxic.

2. The material of claim 1, wherein 0.2≤x≤0.8, and 1<z<4.

3. The material of claim 1, wherein M1 is Ca.

4. The material of claim 1, wherein M2 is Co.

5. The material of claim 4, wherein the Co has an oxidation state of Co$^{3+}$ or Co$^{4+}$.

6. The material of claim 1, wherein the material is polycrystalline.

7. The material of claim 1, wherein the material has pores having an average pore size ranging from 0.5 μm to 2 μm and a porosity from 1% to 50%.

8. The material of claim 1, wherein x ranges from 0.01 to 0.7.

9. The material of claim 1, wherein the material is capable of direct bonding to Au leads, Ag leads, or a combination thereof.

10. A thermoelectric system, comprising:
the thermoelectric material of claim 1 having a zT which is a function of temperature such that zT>0.5 for temperatures greater than 350 K and zT>1.0 for temperatures greater than 700 K; and
a pair of electrodes electrically associated with the thermoelectric material at locations remote from one another forming a temperature differential zone.

11. The thermoelectric system of claim 10, wherein the pair of electrodes are leads selected from the group consisting of copper, silver, gold, ITO, or a combination thereof.

12. The thermoelectric system of claim 11, wherein the pair of electrodes are electrically conductive leads which are directly connected to the thermoelectric material without any intervening material.

13. A method of making the thermoelectric material of claim 1 comprising:

Combining stoichiometric amounts of powder $M1_yO_u$, $M2_zO_v$, and $Tb_xO_t$ to form a homogenous powder;

Grinding the homogenous powder;

Calcining the homogenous powder at a first temperature ranging from 500° C. to 700° C. for a period of time ranging from 1 min to 1 hour; and iso-statically compacting the calcined homogenous powder at a pressure ranging from 10 MPa to 80 MPa to form compacted pellets of the thermoelectric material; where M1 is one of Ca, Mg, Sr, Ba and Ra, M2 is at least one of Co, Fe, Ni and Mn, t ranges from 0.0175 to 8.75; u ranges from 1 to 5; v ranges from 1 to 6; z ranges from 0.91 to 5; y is 1, 2, 3, or 5; z is 1, 2, 3, or 4; and w is 1, 2, 3, 4, 5, 7, 7, 9, or 14.

14. The method of claim 13, further comprising:

grinding the calcined homogenous powder to form a ground calcined homogenous powder, and further calcining the ground homogenous powder at a second temperature at least 25° C. higher than the first temperature for a period of time ranging from about 2 hours to about 24 hours prior to compacting the calcined homogenous powder.

15. The method of claim 13, further comprising:

sintering the compacted pellets at a temperature ranging from 1000 K to 1500 K for a period of time ranging from 10 hours to 30 hours.

\* \* \* \* \*